United States Patent
Nuriya et al.

(10) Patent No.: US 9,462,715 B2
(45) Date of Patent: *Oct. 4, 2016

(54) WATERPROOF CONTROL UNIT

(71) Applicant: Mitsubishi Electric Corporation, Chiyoda-ku, Tokyo (JP)

(72) Inventors: Nobuaki Nuriya, Chiyoda-ku (JP); Mitsunori Nishida, Chiyoda-ku (JP); Osamu Nishizawa, Chiyoda-ku (JP)

(73) Assignee: Mitsubishi Electric Corporation, Tokyo (JP)

( * ) Notice: Subject to any disclaimer, the term of this patent is extended or adjusted under 35 U.S.C. 154(b) by 174 days.

This patent is subject to a terminal disclaimer.

(21) Appl. No.: 14/334,154

(22) Filed: Jul. 17, 2014

(65) Prior Publication Data

US 2015/0282362 A1    Oct. 1, 2015

(30) Foreign Application Priority Data

Mar. 28, 2014   (JP) .................. 2014-067443

(51) Int. Cl.
*H05K 7/00* (2006.01)
*H05K 5/06* (2006.01)
*H05K 5/00* (2006.01)

(52) U.S. Cl.
CPC ............ *H05K 5/061* (2013.01); *H05K 5/0056* (2013.01); *H05K 5/06* (2013.01)

(58) Field of Classification Search
CPC ....... H05K 5/061; H05K 5/06; H05K 5/0056
USPC ............... 361/728–730, 748, 752, 796, 800, 361/679.01, 679.02, 736, 816; 174/50.5, 174/50.51, 50.52, 359, 520; 312/223.1–223.3
See application file for complete search history.

(56) References Cited

U.S. PATENT DOCUMENTS

| | | | |
|---|---|---|---|
| 8,520,397 B2* | 8/2013 | Azumi ................. | H05K 5/0052 361/730 |
| 8,770,989 B2* | 7/2014 | Ohhashi ............. | H01R 13/5202 439/589 |
| 8,942,001 B2* | 1/2015 | Kawai .................. | H05K 5/0052 174/50.5 |
| 2008/0045061 A1* | 2/2008 | Hayashi ............. | H01R 13/5202 439/246 |
| 2009/0068862 A1* | 3/2009 | Honda ................. | H05K 5/0052 439/78 |
| 2009/0129035 A1 | 5/2009 | Kojima | |

(Continued)

FOREIGN PATENT DOCUMENTS

| | | |
|---|---|---|
| JP | 2009-070855 A | 4/2009 |
| JP | 2009-123558 A | 6/2009 |
| JP | 2013-004611 A | 1/2013 |

*Primary Examiner* — Courtney Smith
*Assistant Examiner* — Sagar Shrestha
(74) *Attorney, Agent, or Firm* — Sughrue Mion, PLLC

(57) ABSTRACT

A waterproof control unit is provided in which: connector housing is fixedly positioned onto circuit board that is mounted onto base; a first seal gap G1 formed of the connector housing and a cover, a second seal gap G2 formed of the connector housing and the base and a third seal gap G3 formed of the base and the cover are included; the first seal gap G1 is formed of a terrace slope portion gap G1*b* and an outer step flat portion gap G1*a* and an inner step flat portion gap G1*c* that are in communication with the terrace slope portion gap G1*b*; a gap setting protrusion for limiting the gap width is provided at least in the first seal gap G1; and, between the connector housing and the cover, a horizontal movement limitation member are provided for limiting the relative positional relationship between the connector housing and the cover.

16 Claims, 12 Drawing Sheets

(56) References Cited

U.S. PATENT DOCUMENTS

| | | | | |
|---|---|---|---|---|
| 2010/0103632 A1* | 4/2010 | Kato | .................. | H05K 5/006 361/752 |
| 2011/0211311 A1* | 9/2011 | Shinoda | ............... | H05K 5/0047 361/694 |
| 2012/0069532 A1* | 3/2012 | Azumi | ................. | H05K 5/0052 361/752 |
| 2012/0320531 A1* | 12/2012 | Hashimoto | .......... | H05K 5/0052 361/720 |
| 2013/0069320 A1* | 3/2013 | Yanagisawa | ......... | H05K 5/0056 277/628 |
| 2013/0070432 A1* | 3/2013 | Kawai | .................. | H05K 5/0052 361/752 |

\* cited by examiner

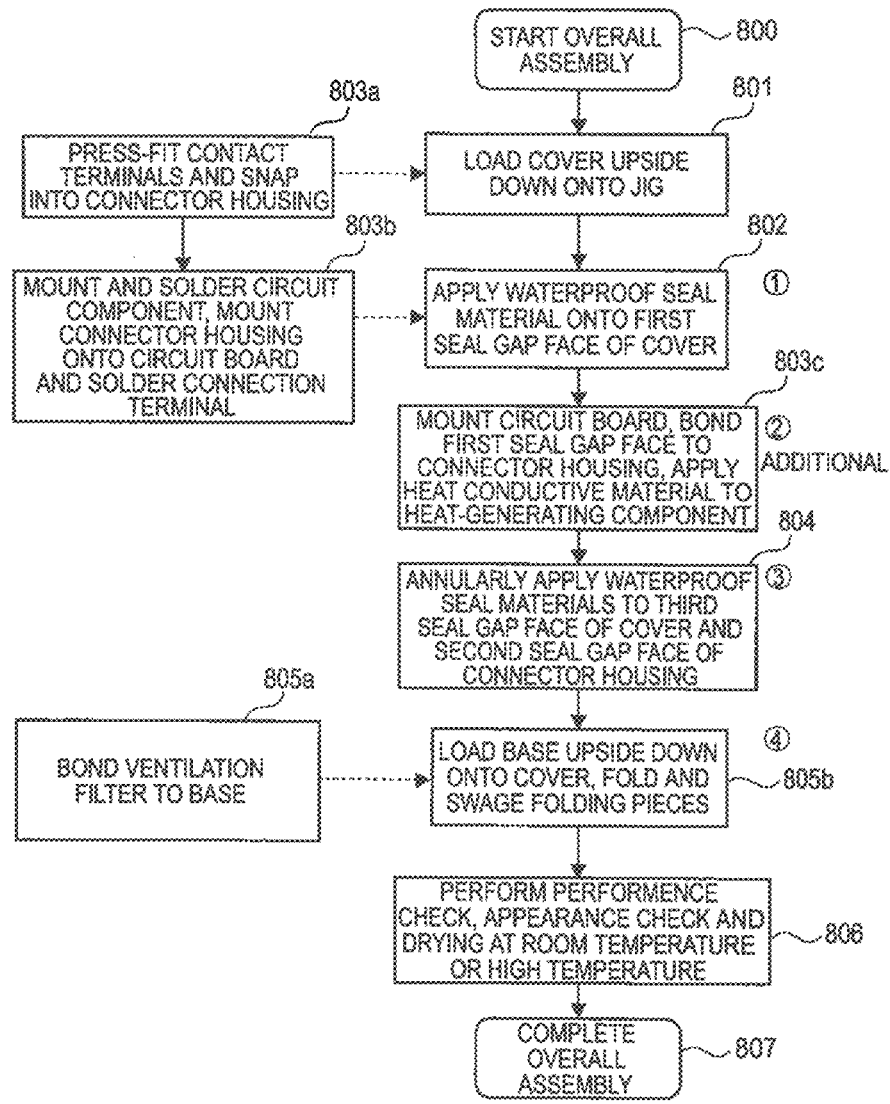

WATERPROOF CONTROL UNIT

BACKGROUND OF THE INVENTION

1. Field of the Invention

The present invention relates to a waterproof control unit, such as an in-vehicle electronic control unit installed in an engine room.

2. Description of the Related Art

Among conventional waterproof control units, one example waterproof control unit that is widely used includes: an enclosure formed of a base and a cover as described below; a circuit board hermetically contained in the enclosure with circuit components and a plurality of contact terminals for external connection mounted thereon and a resin-molded connector housing positioned and fixed; and waterproof seal material that fills first to third seal gaps in order to expose outside the enclosure the edge face of the connector housing with the plurality of contact terminals provided therethrough, the first seal gap being provided between the abutting faces of the connector housing and the cover, the second seal gap being provided between the abutting faces of the connector housing and the base, the third seal gap being provided between the abutting faces of the base and the cover.

Furthermore, a convexo-concave seal face method is widely used in which, as a waterproof seal face, for example, a convexo-concavo-convex thread is provided on the outer periphery of the cover, while a concavo-convexo-concave thread is provided on the outer periphery of the base, then the convexo-concave seal gap made by loosely fitting the convex thread on one side to the concave thread on the other side is filled with waterproof seal material.

In this case, the connector housing to be placed between the cover and the base needs to have a concavo-convexo-concave thread provided on the seal face of the cover side and a convexo-concavo-convex thread provided on the seal face of the base side, so two types of convexo-concave seal faces need to be provided in the connector housing.

A first advantage of such a convexo-concave seal face method is that, even with a small seal width, a long water exposure prevention distance (seal path) can be obtained. A second advantage is that, even when one of the convex thread wall surfaces abuts one of the concave thread wall surfaces to cause the film thickness of the waterproof seal material to be zero due to an assembly dimension error of the cover and the base, a gap between the other of the convex thread wall surfaces and the other of the concave thread wall surfaces is filled with the waterproof seal material, so at least one of the gaps between the wall surfaces is surely filled with a predetermined amount of the waterproof seal material.

On the other hand, a first disadvantage of the convexo-concave seal face method is that, as described above, two types of convexo-concave seal faces need to be provided in the connector housing, which causes the connector housing to be long-bodied and also increases the dimension of the plurality of contact terminals press-fit into the connector housing, so a measure to suppress increase in the electric resistance is required.

Furthermore, a second disadvantage of the convexo-concave seal face method is that, in order to ensure an adequate fitting depth of the convexo-concave faces, the apparent thickness dimension between the seal faces needs to be increased. Furthermore, a third disadvantage is that, for example, with a sheet metal cover, it is difficult to make a fine convexo-concave face that is narrow and deep, and even with a resin-molded cover, it is almost impossible to make a convexo-concave face that is excessively narrow and deep from the viewpoint of mold life, so an expected compact size is limited, and an attempt to reduce the load on the mold increases the body length of the connector housing.

For example, referring to FIGS. 3 and 1 of Patent Document 1 "Electronic Apparatus" listed below, an electronic apparatus is shown in which a printed circuit board 40 with a connector mounted thereon is contained in an enclosure and an internal space of the enclosure is waterproof, in which an upper case 20 (corresponding to the cover) and a lower case 30 (corresponding to the base) forming the enclosure include as a seal portion for abutting a seal material: an enclosure-side concave portion 35b formed on one of opening edge portions for connector; and an enclosure-side convex portion 25b formed on the other of the opening edge portions for connector, and in which apart opposed to the opening edge portions for connector on the surface of a housing 51 includes as an annular seal portion for abutting a seal material: a connector-side convex portion 54 to be inserted into the enclosure-side concave portion 35b with a seal material placed therein; and a connector-side concave portion 53 to be inserted into the enclosure-side convex portion 25b with a seal material placed therein, which are continuously formed.

Accordingly, the width of the connector-side concave portion 53 includes the width of the other two concave portions and the width of the connector-side convex portion 54, which corresponds to three times the width of the other concave portion. However, as shown in FIG. 1, the concave portions on both side of the connector-side convex portion 54 is in communication with the connector-side concave portion 53, so a waterproof seal material can be continuously applied as an advantage.

Furthermore, the seal faces between the housing 51 and the upper/lower cases 20, 30 are integrated with the outer face of a partition wall of the connector 50 with a connector terminal press-fit thereinto to limit the width of the convex portions and concave portions so that the total dimension of the press-fitting dimension of the connector terminal and the contacting dimension of the counter-side connector is suppressed to a minimum so as not to provide a long-dimensioned terminal.

Furthermore, referring to FIGS. 3 and 1 of Patent Document 2 "Electronic Control Apparatus" listed below, an electronic control apparatus 10 is shown in which a seal material 130 is placed between the opposing parts of the periphery of an upper case 50 (corresponding to the cover) and the periphery of a lower case 70 (corresponding to the base) forming an enclosure, between the opposing parts of a housing 111 of a connector 110 mounted on a circuit board 90 and the periphery of the upper case 50 and between the opposing parts of the housing 111 and the periphery of the lower case 70, and an internal space of the enclosure containing the circuit board 90 is waterproof, in which a convex portion for upper seal 57 provided on the upper case 50 and a concave portion for upper seal 119 provided on the housing 111 fit to each other, the convexo-concave seal faces of which are provided inside the partition wall of the housing 111, and in which a concave portion for lower seal 77 provided on the lower case 70 and a convex portion for lower seal 120a provided on the housing 111 fit to each other, the convexo-concave seal faces of which are provided outside the partition wall of the housing 111.

Thus, the seal faces between the housing 111 and the upper/lower cases 50, 70 are distributed between the inside face and the outside face of the partition wall of the connector 110 with a connector terminal press-fit thereinto to limit the width of the convex portions and concave portions so that the total dimension of the press-fitting dimension of the connector terminal and the contacting dimension of the counter-side connector is suppressed to a minimum so as not to provide a long-dimensioned terminal.

Furthermore, referring to FIG. 3 of Patent Document 3 "Board Container Enclosure For In-vehicle Electronic Apparatus" listed below, a circuit board 40 is hermetically contained in a metal enclosure formed of a metal base 30 and a metal cover 20; a concave thread provided on the cover 20 and a convex thread provided on a connector housing 41 fit to each other, the convexo-concave seal faces of which are provided inside the partition wall of the connector housing 41; and a convex thread provided on the base 30 and a concave thread provided on the connector housing 41 fit to each other, the convexo-concave seal faces of which are also provided inside the partition wall of the connector housing 41.

However, the two types of convexo-concave seal faces provided on the connector housing 41 are placed deviated from each other, which causes the connector housing to be long-bodied.

As described above, in any case of the Patent Documents 1 to 3, the two types of convexo-concave seal faces need to be provided on the connector housing, which causes the connector housing to be long-bodied, in which the two types of convexo-concave seal faces need to be in communication with each other via a waterproof seal material, which are connected to a common pool in the cases of the Patent Documents 2 and 3.

[Patent Document 1] JP-A-2009-070855
[Patent Document 2] JP-A-2009-123558
[Patent Document 3] JP-A-2013-004611

The "Electronic Apparatus" according to the Patent Document 1 is provided in the housing 51, in which the convexo-concavo-convex seal face centering the connector-side concave portion 53 fitting to the enclosure-side convex portion 25b of the upper case 20 and the concavo-convexo-concave seal face centering the connector-side convex portion 54 fitting to the enclosure-side concave portion 35b of the lower case 30 cross and join together in the middle portion of the side face of the housing 51.

Accordingly, the connector opening portion of the upper case 20 and the connector opening portion of the lower case 30 are rising up to the middle portion of the side face of the connector, so a problem is that the total weight is large when, for example, the lower case 30 is made of aluminum die-cast and the upper case 20 is resin-molded.

The "Electronic Control Apparatus" according to the Patent Document 2 is provided in the housing 111, in which the convexo-concavo-convex seal face centering the concave portion for upper seal 119 fitting to the convex portion for upper seal 57 of the upper case 50 and the concavo-convexo-concave seal face centering the convex portion for lower seal 120a fitting to the concave portion for lower seal 77 of the lower case 70 are placed with the partition wall of the housing 111 in between.

Accordingly, the lower case 70 is extended beyond the partition wall of the housing 111, so a problem is that the total weight is large when, for example, the lower case 70 is made of aluminum die-cast and the upper case 50 is resin-molded.

The "Board Container Enclosure For In-vehicle Electronic Apparatus" according to the Patent Document 3 is provided in the connector housing 41, in which the concavo-convexo-concave seal face centering the connector housing-side convex thread fitting to the concave thread of the cover 20 and the convexo-concavo-convex seal face centering the connector housing-side concave thread fitting to the convex thread of the base 30 cross and join together in both edge portions in longitudinal direction of the connector housing 41 in the base 30.

Accordingly, a problem is that a long-bodied connector is provided. Another problem is that the cover 20 and the base 30 are made of a sheet metal, and the convexo-concave seal face pressed corrugated is shallow and wide, so the connector is further long-bodied and the connector pin is elongated, which increases the cost. Another problem is that, even when the cover is resin-molded and the base is made of aluminum die-cast, for a narrow and deep convexo-concave seal face, making a mold is difficult, demolding is difficult, and also mold life is short. This also applies to the cases of the Patent Documents 1 and 2.

SUMMARY OF THE INVENTION

In addition to solving the above problem, it is an object of the present invention to provide a waterproof control unit in which a mold structure for a cover or a base to be mold-processed or sheet metal-processed is simplified and also a connector housing is configured so as not to be long-bodied.

The waterproof control unit in accordance with the invention is a waterproof control unit in which: a circuit board is fixedly contained in an enclosure formed of a base and a cover; a plurality of circuit components and a resin-molded connector housing are fixedly positioned on the circuit board; in order to expose outside the enclosure the edge face of the connector housing with a plurality of contact terminals for external connection fixed therethrough, a first seal gap provided between the abutting faces of the connector housing and the cover, a second seal gap provided between the abutting faces of the connector housing and the base, and a third seal gap provided between the abutting faces of the base and the cover are filled with waterproof seal materials, wherein the first seal gap, or the first seal gap and the second seal gap, includes a terrace slope portion gap, an outer step flat portion gap and an inner step flat portion gap that are a slit-like space including a pair of terrace slope portions formed of the connector housing and the cover or the base, a pair of outer step flat portions in communication with the terrace slope portions and a pair of inner step flat portions, the outer step flat portions being located on the outer side of the enclosure than the inner step flat portions, wherein a gap limitation member and a planar movement limitation member are provided between the connector housing and the cover forming the first seal gap, wherein the gap limitation member is a gap setting protrusion that is provided on the outer step flat portions or the inner step flat portions of one of the connector housing and the cover and that abuts the other, wherein the planar movement limitation member includes a pair of opposed members for limiting the relative position of the connector housing such that the gap dimension in the horizontal direction between the terrace slope portions of the connector housing and the cover falls within a predetermined range, the horizontal direction being parallel to the board surface of the circuit board, and wherein the pair of opposed members include a pair of side face convex threads protruded from the connector housing on the right and left sides and fitting concave threads provided on the cover, the side face convex threads loosely fitting into the fitting concave threads to form a pair of convexo-concave engagement seal faces.

According to the waterproof control unit of the invention, the enclosure hermetically contains the circuit board by the base, the cover and the connector housing; the waterproof seal material at least between the connector housing and the cover or the base fills the slit-like space formed of the pair of terrace slope portions, outer step flat portions and inner step flat portions; and the slit-like space formed of the cover and the connector housing is configured to ensure predetermined waterproof seal faces by the gap limitation member and the planar movement limitation member.

Accordingly, the invention provides an effect of simplifying the mold structure for the cover or the base to be mold-processed or sheet metal-processed, thereby reducing the mold cost and also configuring the connector housing so as not to be long bodied, thereby allowing use of an inexpensive connector pin.

Furthermore, in comparison with providing two set of convexo-concave seal faces (one set for the cover, the other set for the base) on the connector housing, for example, using terrace slope portions for the cover and the base or combining terrace slope portions and one set of convexo-concave seal faces is possible, this combination providing an effect of reducing the total width of the seal faces and achieving sealing performance not inferior to the case using two set of convexo-concave seal faces.

Note that, even in combining terrace slope portions and one set of convexo-concave seal faces, the mold structure can be simplified by increasing the width of the convexo-concave seal faces and decreasing the fitting depth with respect to the case of providing two set of convexo-concave seal faces.

Furthermore, advantageously, terrace slope portions allow the seal path to be longer than that of horizontal planes and can improve strength of the thin-walled cover or base and reduce the thickness and cost of the cover or base.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 13 illustrates an assembly process of the waterproof control unit of the second embodiment of the invention;

DETAILED DESCRIPTION OF THE PREFERRED EMBODIMENTS

Figure 1:
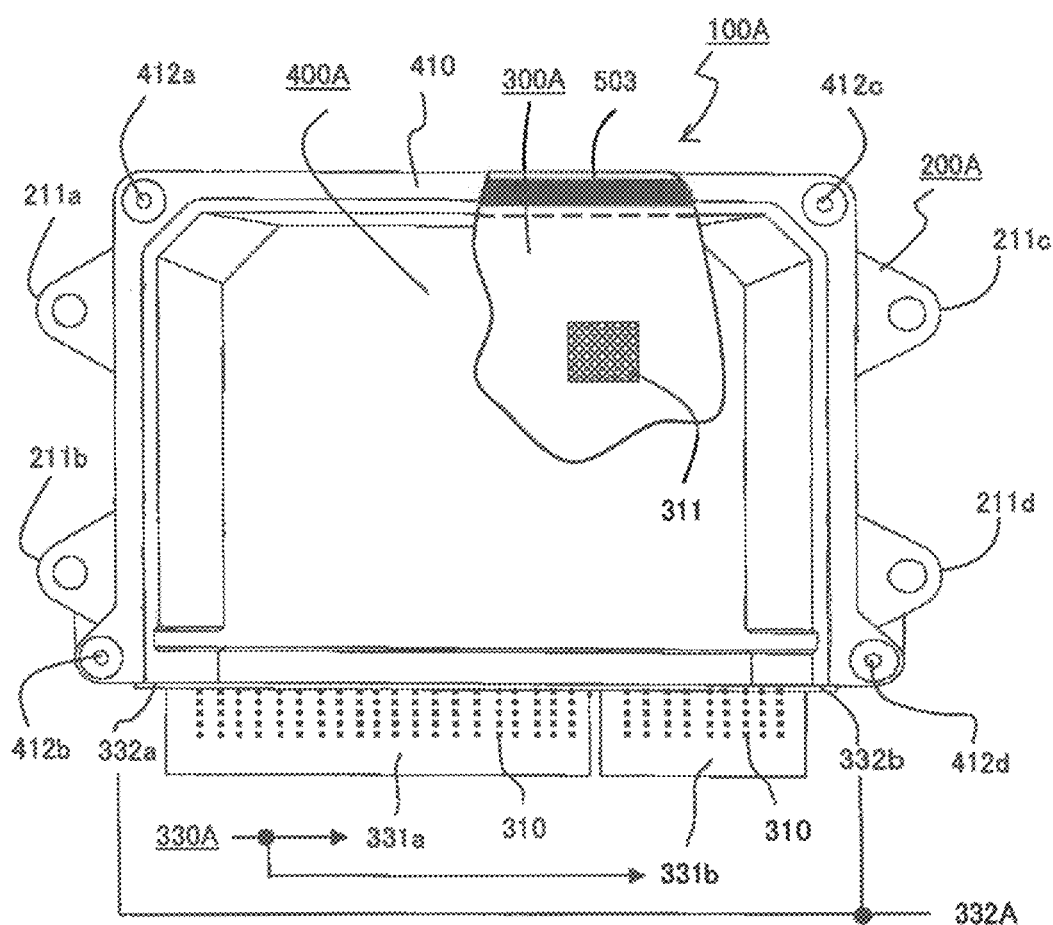
FIG. 1 is a plan view showing a waterproof control unit of a first embodiment of the invention.

Embodiments of the invention are described below with reference to the drawings. Note that, through the drawings, the same or corresponding components are denoted by the same reference numerals.

First Embodiment

First, a waterproof control unit in accordance with a first embodiment of the invention is described with reference to FIGS. 1 to 7. In FIG. 1, a waterproof control unit 100A includes: an aluminum die-cast base 200A having mounting legs 211a-211d at four locations; a circuit board 300A with a plurality of circuit components 311 and heat-generating components 311a, 311b described later (see FIG. 2) mounted thereon; and a bottomless box-shaped resin cover 400A having a flange 410 on the outer periphery wall at three of the sides, in which, on the other one side of the cover 400A, corresponding part of the outer periphery wall is missing and a side face opening 100W (see FIG. 3) closed by a connector housing 330A is provided.

Figure 3:
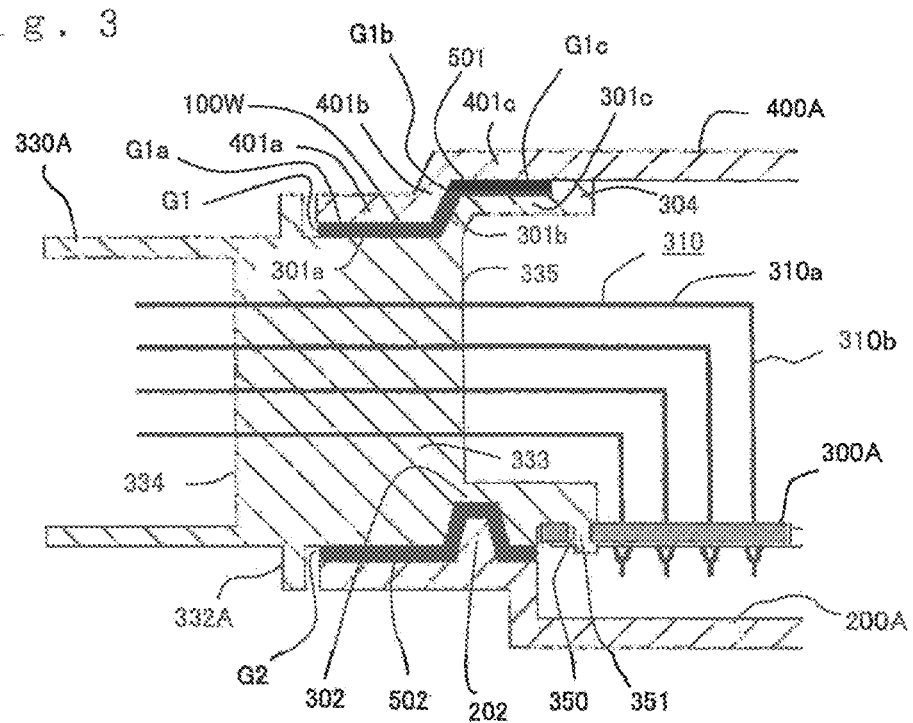
FIG. 3 is a cross-sectional view showing in detail a connector housing part of the waterproof control unit of the first embodiment of the invention.

Note that an enclosure of the waterproof control unit 100A is formed of the base 200A and the bottomless box-shaped resin cover 400A covering the base 200A. A first and second connector housings 331a, 331b are integrally molded into the connector housing 330A that is attached to one side of the circuit board 300A. Annular peripheral walls 332a, 332b described later with reference to FIG. 3 are protruded from the outer periphery of the first and second connector housings 331a, 331b, the annular peripheral walls 332a, 332b being generally referred to as an annular peripheral wall 332A.

Figure 2:
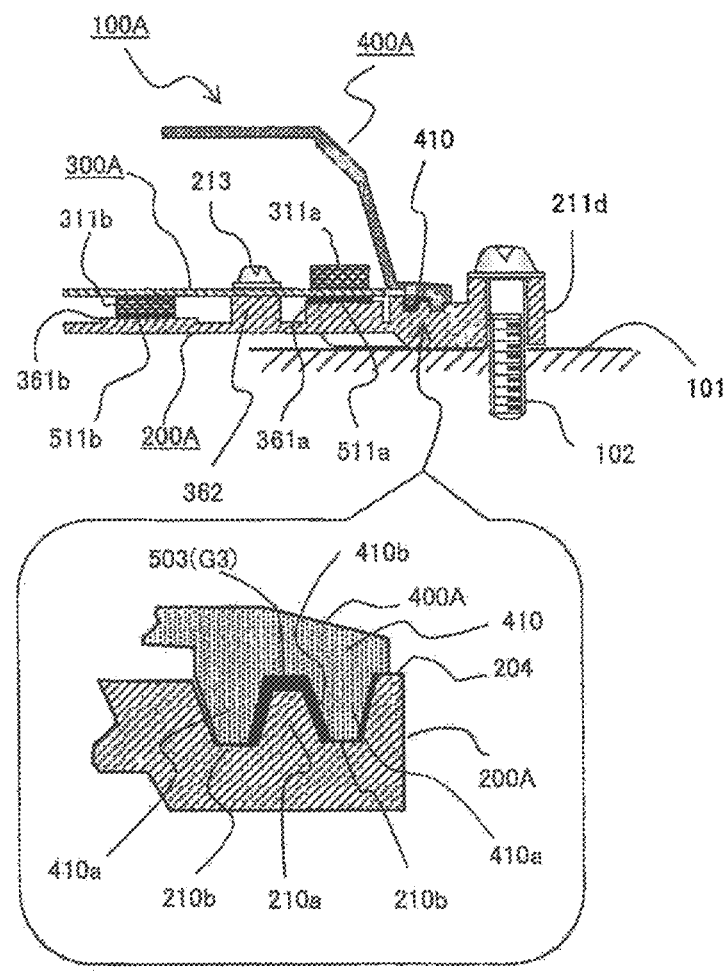
FIG. 2 is a cross-sectional view showing, in part, the main part of the waterproof control unit of the first embodiment of the invention.

In FIG. 2, mounting screws 102 for fixedly-mounting the waterproof control unit 100A onto a mounting face 101 are inserted into unloaded holes of the mounting legs 211a-211d provided at the four locations of the base 200A and screwed into tapped holes provided in the mounting face 101 using a screw tightening tool not shown.

Between the bonding surfaces of the cover 400A and the base 200A on the three sides of the outer periphery, a plurality of adjacent convex threads 410a, 210a and a plurality of adjacent concave threads 410b, 210b engage with each other to form convexo-concave seal faces with a waterproof seal material 503 applied thereto, i.e., a third seal gap G3. Using the tapped holes 412a-412d shown in FIG. 1 provided at four corners of the cover 400A, the cover 400A and the base 200A are fixedly co-tightened by fixing screws not shown from the rear side of the base 200A.

At this time, the cover 400A abuts a gap setting abutting face 204 of the base 200A to determine the gap dimension of the third seal gap G3 for the waterproof seal material 503 to be applied thereto. The circuit board 300A is fixedly tightened by a plurality of fixing screws 213 to a plurality of fixing pedestals 362 provided on the inner surface of the base 200A. Note that the circuit board 300A may also be held between the cover 400A and the base 200A at the three sides of the outer periphery instead of being fixedly tightened by the fixing screws 213.

In this case, preferably, positioning holes not shown are provided at opposite side locations of the circuit board 300A, then protrusions not shown provided on the base 200A are fit into the position holes to limit the position of the circuit board 300A relative to that of the base 200A, which applies to a second embodiment described later.

However, the position of the circuit board 300A relative to that of the base 200A can also be limited using an assembly jig.

The circuit board 300A includes: the first heat-generating component 311a mounted on the board surface on the cover 400A side; and the second heat-generating component 311b mounted on the board surface on the base 200A side. The base 200A includes: a first heat transfer pedestal 361a adjacent to the bottom surface of the first heat-generating component 311a; and a second heat transfer pedestal 361b adjacent to the rear surface of the second heat-generating component 311b, in which heat conductive adhesives 511a, 511b are applied to the surfaces of the first and second heat transfer pedestals 361a, 361b.

In FIG. 3, the connector housing 330A representative of the first and second connector housings 331a, 331b includes: the annular peripheral walls 332A (332a, 332b) described above with reference to FIG. 1; and a partition wall 333 with a right-angle type contact terminal 310 press-fit thereinto. The annular peripheral walls 332A (332a, 332b) is provided at the boundary position between the exposed portion and the non-exposed portion of the outer periphery face of the connector housing with respect to the enclosure, opposite to and spaced from the edge of the side face opening 100W. A counterpart connector not shown is inserted into the outside of an outer boundary face 334 of the partition wall 333, then a counterpart contact terminal to be in contact and electrical communication with one end of the contact terminal 310 is inserted.

The contact terminal 310 has a horizontal portion 310a and a vertical portion 310b that are exposed inside an inner boundary face 335 of the partition wall 333, the tip of the vertical portion 310b passing through the circuit board 300A and being connected to the rear side by soldering.

Note that when the vertical portion 310b of the contact terminal 310 expands or contracts due to change in environmental temperature, the horizontal portion 310a bends to prevent the solder connection to the circuit board 300A from being damaged. When the horizontal portion 310a of the contact terminal 310 expands or contracts due to change in environmental temperature, the vertical portion 310b bends to prevent the press-fit portion of the partition wall 333 from being stressed.

Furthermore, a board hole 350 is provided on both sides of the left side (on the opening side) of the circuit board 300A. Then, a positioning protruding piece 351 (e.g., a snap pin) press-fit into the connector housing 330A fits into the board hole to limit the mounting position of the connector housing 330A relative to that of the circuit board 300A. In the side face opening 100W of the cover 400A at which part of the connector housing 330A is exposed, an outer step flat portion 401a, a terrace slope portion 401b and an inner step flat portion 401c are provided, and, opposite to these members, an outer step flat portion 301a, a terrace slope portion 301b and an inner step flat portion 301c are provided, respectively, on the connector housing 330A side. These members become paired to form: a terrace slope portion gap G1b; an outer step flat portion gap G1a in communication with the outer edge of the terrace slope portion gap; and an inner step flat portion gap G1c in communication with the inner edge of the terrace slope portion gap, the coupling of the three gaps forming a first seal gap G1 with a waterproof seal material 501 applied thereto.

Note that the waterproof seal material 501 is applied beyond the inner boundary face 335 of the partition wall 333. So, the short dimension top side portion and the hypotenuse portion of the partition wall 333 are extended inwardly from the inner boundary face 335 of the partition wall 333, then, to this extended portion, the inner edge of the inner step flat portion 301c, i.e., the inner step flat portion gap G1c is extended.

Furthermore, a plurality of gap setting protrusions 304 forming a gap limitation member are protruded from the inner edge face of the inner step flat portion 301c of the connector housing 330A. The gap setting protrusions 304 abut the inner face of the cover 400A to prevent the first seal gap G1 from being too small. The gap setting protrusions 304 may also be provided on the inner face side of the cover 400A or may also be provided at the outer step flat portion 301a of the connector housing 330A or the outer step flat portion 401a of the cover 400A. Furthermore, the gap setting protrusions 304 may also overlap with the boundary position of the waterproof seal material 501 with part of the gap setting protrusions 304 included in the application area of the waterproof seal material 501.

Figure 4:
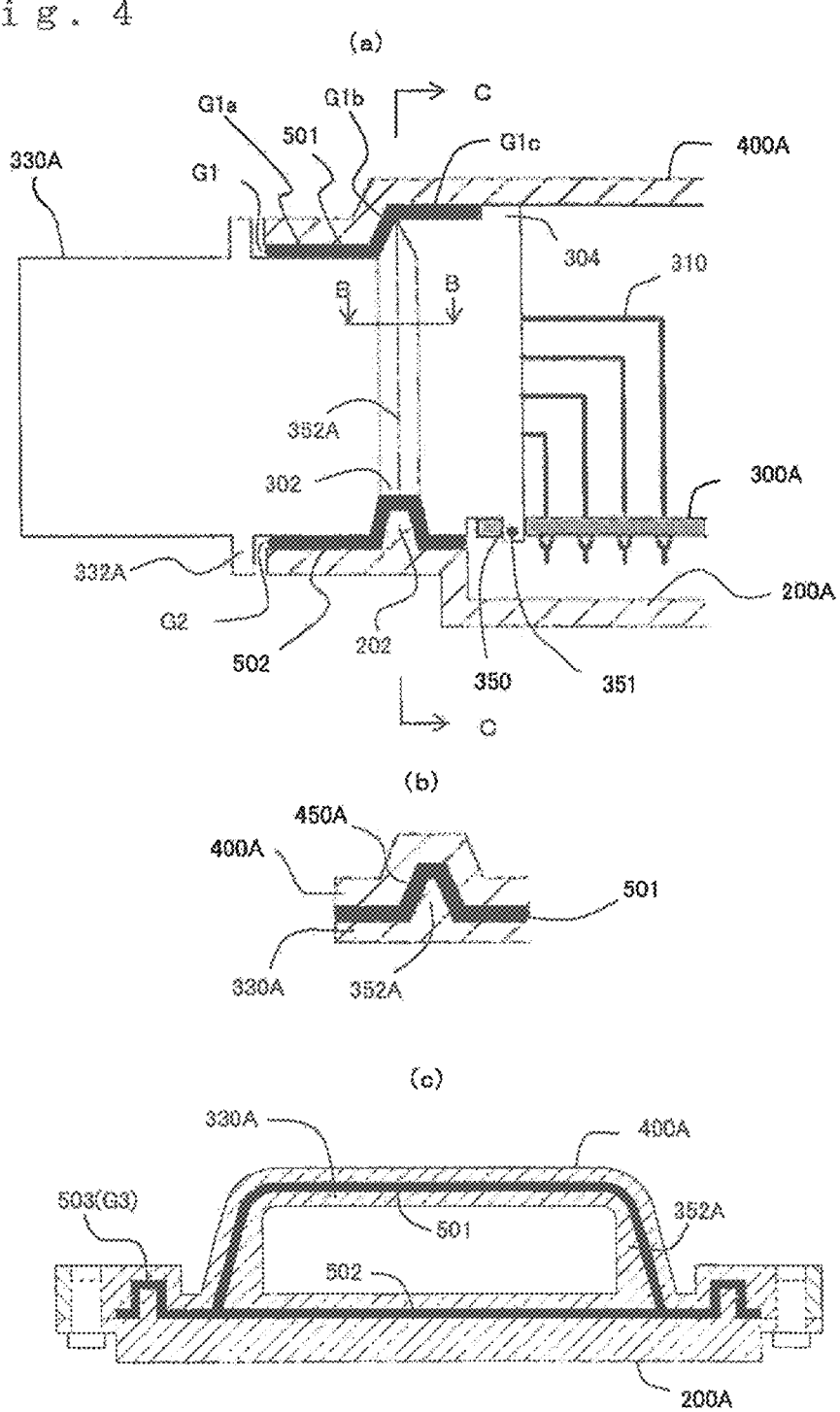
FIG. 4 illustrates a planar movement limitation member of the first embodiment of the invention in which (a) is a cross-sectional view viewing from the side face, (b) is a cross-sectional view taken along the line B-B in FIG. 4(a) viewing in the arrow direction, and (c) is a cross-sectional view taken along the line C-C in FIG. 4(a) viewing in the arrow direction.

A second seal gap G2 shown in FIGS. 3 and 4 is formed of a second concave thread 302 provided on the bottom face of the connector housing 330A and a second convex thread 202 provided on the left side of the base 200A, in which the second convex thread 202 is loosely fit into the second concave thread 302 to form a gap with a waterproof seal material 502 applied thereto.

Note that a gap setting protrusions 304 not shown provided between the connector housing 330A and the base 200A is provided in the second seal gap G2. However, for the second seal gap G2, the gap may also be limited by the height of the mounting face of the circuit board 300A and the base 200A, in which the gap setting protrusions 304 for the second seal gap G2 may also be omitted.

The dimensions of the portions of the first seal gap G1 are configured such that the gap dimension between the outer step flat portions 301a, 401a is smaller than the gap dimension between the inner step flat portions 301c, 401c so that the applied waterproof seal material 501 is less likely to flow to the outside but more likely to flow to the inside.

Next, a planar movement limitation member of the first embodiment of the invention is described with reference to FIG. 4. As seen from FIG. 4(c), the exposed edge face of the connector housing 330A is in a trapezoidal shape. As seen from FIG. 4(a), the first seal gap G1 between the connector housing 330A and the cover 400A, i.e., the gap of the outer step flat portion gap G1a, the terrace slope portion gap G1b and the inner step flat portion gap G1c described with reference to FIG. 3 is filled with the waterproof seal material 501.

Also, in the second seal gap G2 between the connector housing 330A and the base 200A, the gap formed of the convexo-concave seal faces of the second concave thread 302 and the second convex thread 202 is filled with the waterproof seal material 502.

As seen from the FIG. 4(b), on the right and left hypotenuses of the trapezoid of the connector housing 330A, a pair of side face convex threads 352A, 352A protruded from the connector housing 330A on the right and left sides (front and rear sides in FIG. 4(a) when the page is viewed) and fitting concave threads 450A, 450A on the cover 400 side that loosely fit to the side face convex threads form a pair of convexo-concave engagement faces on the right and left sides, the side face convex threads 352A, 352A and the fitting concave threads 450A, 450A functioning as a planar movement limitation member for limiting a relative movement between the connector housing 330A and the cover 400A.

Figure 5:
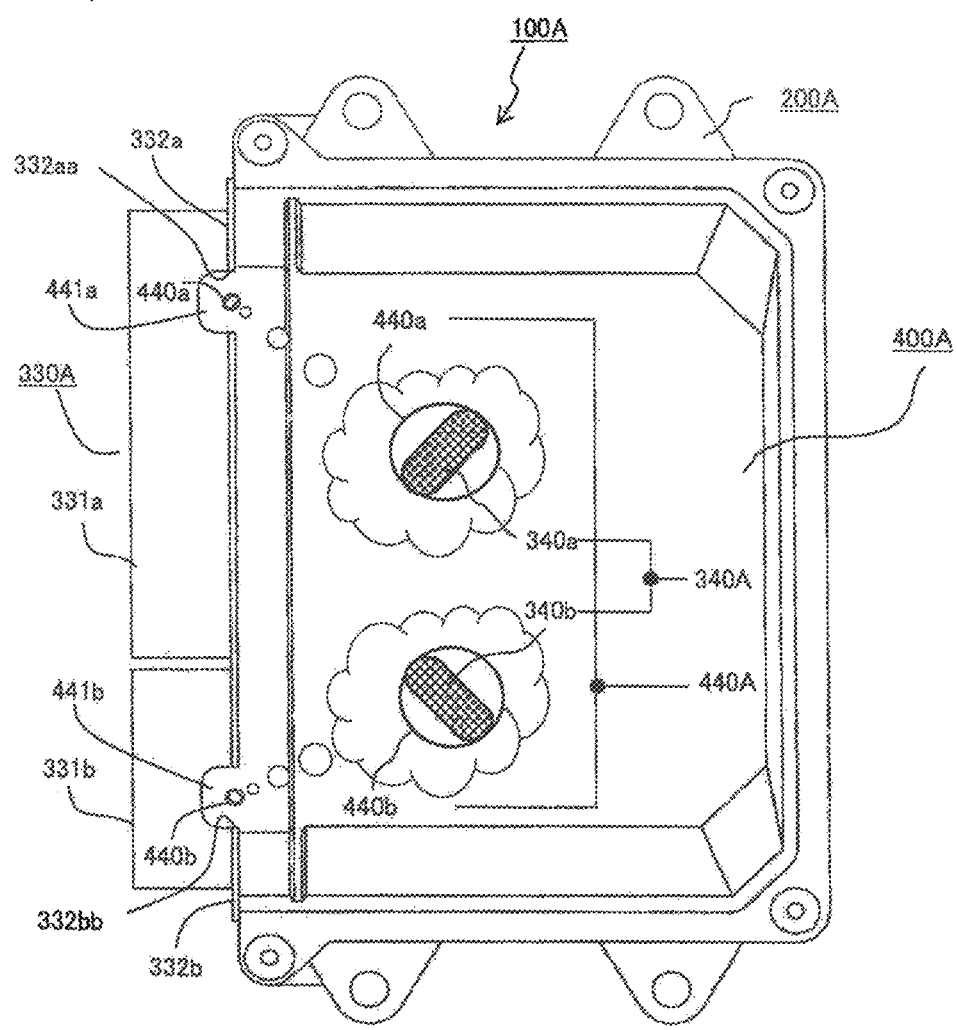
FIG. 5 is a plan view showing the waterproof control unit of the first embodiment of the invention, similarly to FIG. 1.

Next, a mechanism that can determine whether or not an abnormality exists in the relative positional relationship among the cover 400A, the connector housing 330A and the base 200A is described with reference to FIG. 5. In FIG. 5, the annular peripheral walls 332A (332a, 332b) of the connector housing 330A include notches 332aa, 332bb, respectively, from which positioning protrusions 340A (340a, 340b) are protruded. The cover 400A includes protruding tongue pieces 441a, 441b having positioning fitting holes 440A (440a, 440b). The protruding tongue pieces 441a, 441b are fitted into the notches 332aa, 332bb of the annular peripheral walls 332a, 332b, the positioning protrusions 340A (340a, 340b) fitting into the positioning fitting holes 440A (440a, 440b).

Note that the positioning fitting holes 440A (440a, 440b) are a circular hole, while the positioning protrusions 340A (340a, 340b) have an ellipse-shaped cross section. The major axis lines of the pair of positioning protrusions 340A (340a, 340b) are inclined in an inverted V shape such that the major axis lines cross at a location outside the edge face of the connector housing 330A. Furthermore, the depth of the notches 332aa, 332bb of the annular peripheral walls 332a, 332b may be adjusted so that the protruding tongue pieces 441a, 441b of the cover 400A abut the notches 332aa, 332bb, which allows the notches 332aa, 332bb to function also as part of the gap setting protrusions 304 between the connector housing 330A and the cover 400A.

Note that, even when the loosely fitting dimension between the side face convex threads 352A and the fitting concave threads 450A is set to be small so that they function as a main planar movement limitation member, the fitting condition between the positioning protrusions 340A and the positioning fitting holes 440A can be visually checked to determine whether or not an abnormality exists in the relative positional relationship among the cover 400A, the connector housing 330A and the base 200A.

In the above description, the base 200A is made of aluminum die-cast and the cover 400A and the connector housing 330A are made of a resin. However, the cover 400A may be made of a sheet metal, and the third seal gap G3 between the cover 400A and the base 200A may be made with a convexo-concave seal face method using a wavy deformed portion described later with reference to FIG. 9 or a terrace slope method described later with reference to FIG. 12. Furthermore, the second seal gap G2 between the connector housing 330A and the base 200A may also be made with the convexo-concave seal face method using a wavy deformed portion or the terrace slope method.

Figure 6:
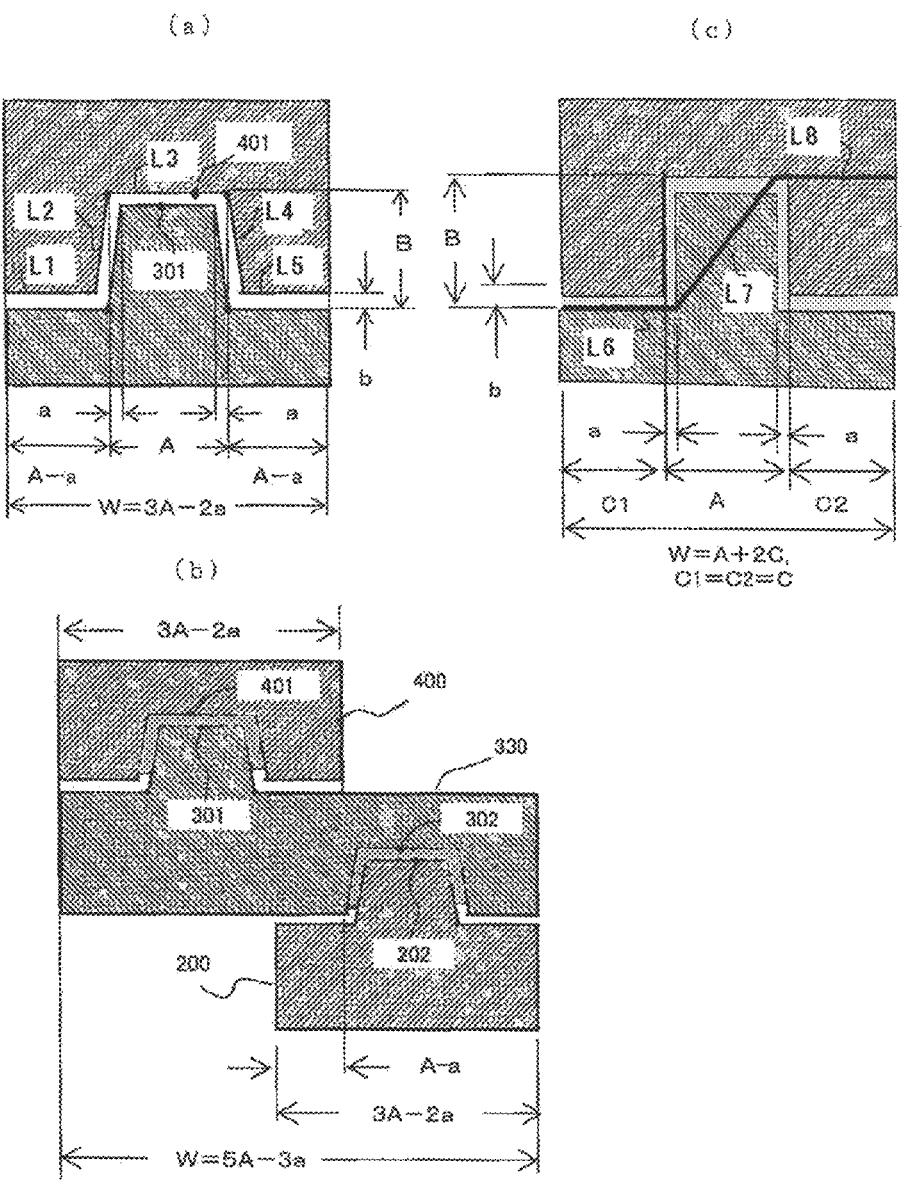
FIG. 6 illustrates a difference between (c) a terrace slope method and (a and b) a convexo-concave seal face method for the seal method of the waterproof control unit of the first embodiment of the invention.

Next, for the waterproof control unit 100A configured as shown in FIGS. 1 to 5, a difference between the terrace slope method and the convexo-concave seal face method is described in detail with reference to FIG. 6. In FIG. 6(a) showing a cross section of convexo-concave seal faces in which a convex thread and a concave thread of a trapezoid tooth are loosely fit to each other, a dimension A is a bottom portion dimension of a concave thread 401 and a convex thread 301. A dimension a is the difference dimension between the tooth widths of the bottom and top portions of the trapezoid tooth. A dimension B is the gap dimension between the bottom and top portions of the trapezoid tooth. A dimension b is the interval dimension of the bottom portion of the trapezoid tooth. In this case, the seal path L0 of the convexo-concave seal face according to the trapezoid tooth is the sum of dimensions from L1 to L5 in FIG. 6(a), in which the dimension L1=L5=A−a, and the dimension L3=A.

The dimension $L2=L4=\sqrt{(B-b)^2+a^2}$. Here, as a first calculation example, with A=3 mm, B=2 mm, α=a/A, β=b/B and α=β=0.1, the dimension L1=L5=3−0.3=2.7 mm, the dimension L3=3 mm and the dimension $L2=L4=\sqrt{(2-0.2)^2+0.3^2}=1.82$ mm, so the seal path L0=(L1+L5)+(L2+L4)+L3=5.4+3.64+3=12.04 mm. On the other hand, the horizontal width dimension of the seal face W=3A−2a=8.4 mm, so, as a result, the seal path is extended by 12.44−8.4=3.64 mm by using the convexo-concave seal face.

In FIG. 6(b) showing a cross section in which two types of convexo-concave seal faces are provided on the connector housing, the connector housing 330 has a first convex thread 301 loosely fit to a first concave thread 401 provided on the cover 400 and also has a second concave thread 302 loosely fit to a second convex thread 202 provided on the base 200, in which a first convexo-concave seal face of the first concave thread 401 and the first convex thread 301 and a second convexo-concave seal face of the second convex thread 202 and the second concave thread 302 are placed with one tooth of deviation from each other. As a result, the seal width W=5A−3a is required. As a second calculation example, with A=3 mm, B=2 mm, α=a/A, β=b/B and α=β=0.1 as with the first calculation example, W=14.1 mm.

In FIG. 6(c) showing a cross section of the seal faces in the terrace slope method, a dimension L6 (which is the width dimension of the seal gap in the outer step flat portion)=a dimension L8 (which is the width dimension of the seal gap in the inner step flat portion)=C+a, (where C1=C2=C). A dimension L7 (which is the length of the seal face of the terrace slope portion)=$\sqrt{(A-2a)^2+B^2}$. So, a seal path dimension Lx=L6+L7+L8=2(C+a)+$\sqrt{(A-2a)^2+B^2}$. As a third calculation example, with A=3 mm, B=2 mm, α=a/A, β=b/B and α=β=0.1 as with the first and second calculation examples, a slope dimension L7=3.12 mm. So, in order to obtain the seal path dimension L0=12.04 mm (=the seal path dimension Lx in the first example), the calculation suggests that C=4.16 mm and the dimension ratio γ=(C−A)/A=0.38. In this case, the seal width dimension W=A+2C=11.32 mm that is less than the seal width dimension of 14.1 mm in the second calculation example by generally one tooth of 2.78 mm.

Figure 7:
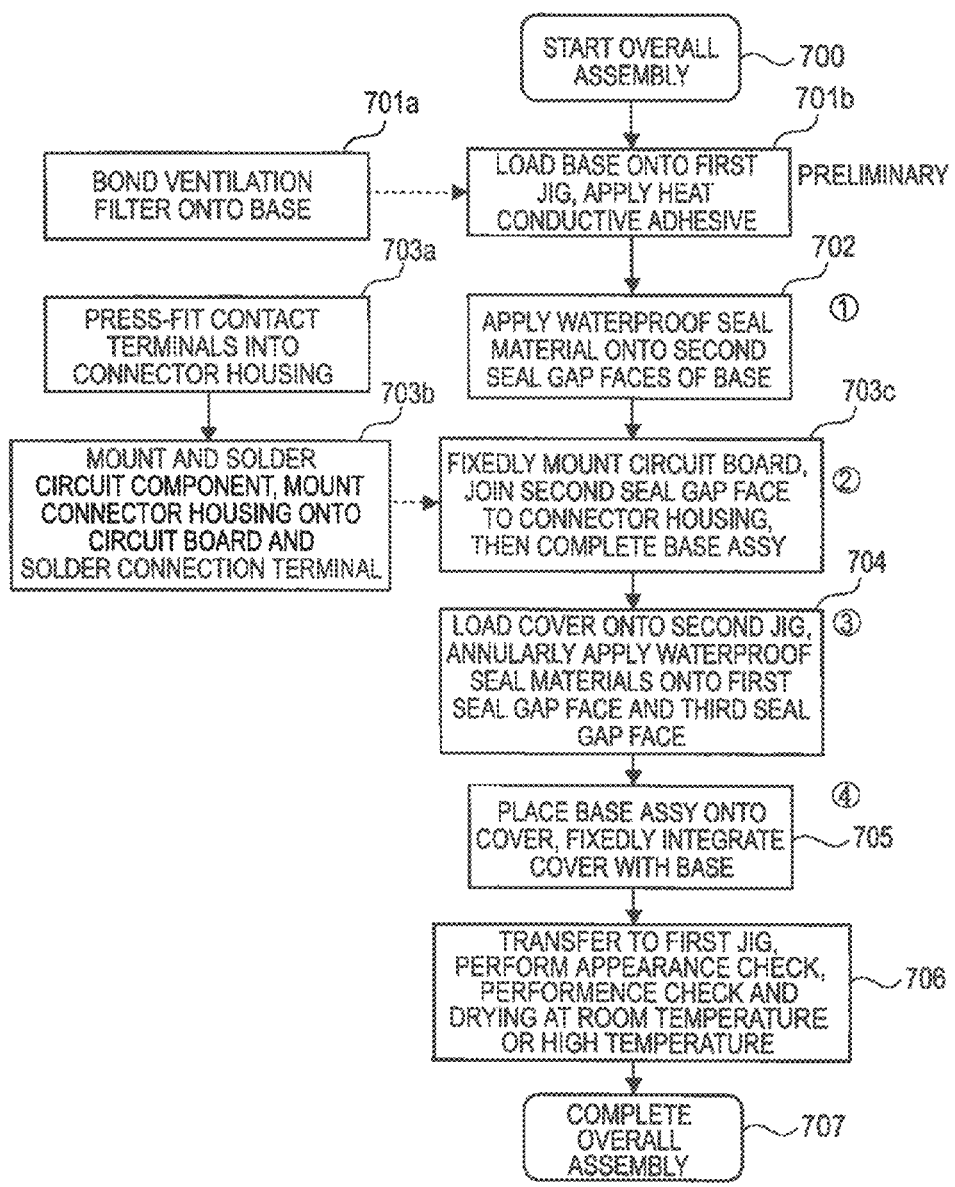
FIG. 7 illustrates an assembly process of the waterproof control unit of the first embodiment of the invention.

Next, an assembly process of the waterproof control unit according to the first embodiment of the invention is described with reference to a flowchart in FIG. 7. In FIG. 7, a step 700 is a starting step of the assembly work of the waterproof control unit 100A, however, preparation steps 701a, 703a and 703b precede the starting step 700. In the preparation step 701a, a ventilation filter not shown is fixedly bonded onto the inner bottom face of the base 200A by an adhesive. In the preparation step 703a, the plurality of contact terminals 310 are fixedly press-fit into the partition wall 333 of the connector housing 330A, and the positioning protruding piece 351 (e.g., a snap) is press-fit into the connector housing 330A and fixedly fit into the board hole 350 of the circuit board 300A.

In the preparation step 703b, the heat-generating components 311a, 311b and the plurality of circuit components 311 are mounted and soldered onto the circuit board 300A, and one ends of the contact terminals 310 are soldered into lands provided on the circuit board 300A to complete an "intermediate assembly of circuit board."

A step 701b following the starting step 700 is a preliminary processing step in which the base 200A onto which the ventilation filter has been fixedly bonded in the preparation step 701a is loaded onto a first jig, then the heat conductive adhesives 511a, 511b are applied to the first and second heat transfer pedestals 361a, 361b of the base 200A.

A next step 702 is a first processing step in which the waterproof seal material 502 is applied onto the second seal gap face of the base 200A.

A next step 703c is a second processing step in which the "intermediate assembly of circuit board" having been completed in the preparation step 703b is loaded onto the base 200A, then the heat conductive adhesives 511a, 511b and the waterproof seal material 502 having been applied in the step 701b and the step 702 are bonded to the counter face.

A next step 704 is a third processing step in which the cover 400A is loaded upside down onto a second jig, then the waterproof seal materials 501, 503 are annularly applied onto the first seal gap face and the third seal gap face.

A next step 705 is a fourth processing step in which the assembly of the circuit board 300A including the connector housing 330A and the base 200A, having been assembled in the step 703c, is placed onto the rear surface of the cover 400A, then the cover 400A is fixedly integrated with the base 200A by screws or swaging members.

In a next step 706, the cover 400A and the base 200A having been integrated with each other in the step 705 is transferred to the first jig, then the dimension check is performed to determine whether or not the first jig interferes with the cover 400A and the base 200A, and furthermore, initial setting, performance check and appearance check of the waterproof control unit 100A is performed while the heat conductive adhesives 511a, 511b and the waterproof seal materials 501, 502, 503, having been applied in the steps 701b, 702 and 704, are dried at room temperature or excessively high temperature, then the process proceeds to an overall assembly completion step 707.

Note that, as the appearance check, the fitting condition between the positioning fitting holes 440A provided in the cover 400A and the positioning protrusions 340A provided on the connector housing 330A is checked, then, through visual determination by comparison with a standard sample or automatic determination by image recognition, it is determined whether or not the relative positional relationship among the cover 400A, the connector housing 330A and the base 200A is correct.

Furthermore, transfer operation between the steps, application processing of heat conductive adhesive and waterproof seal material, screw tightening and the like are all performed automatically, and optimum dose control is performed so that excess or deficiency in the amount of heat conductive adhesive and waterproof seal material will not occur.

Features and effects of the first embodiment are described below. As seen from the above description, a first feature of the first embodiment of the invention is a waterproof control unit 100A in which: a circuit board 300A is fixedly contained in an enclosure formed of a base 200A and a cover 400A; a plurality of circuit components 311 and a resin-molded connector housing 330A are fixedly positioned on the circuit board; in order to expose outside the enclosure the edge face of the connector housing 330A with a plurality of contact terminals 310 for external connection fixed therethrough, a first seal gap G1 provided between the abutting faces of the connector housing 330A and the cover 400A, a second seal gap G2 provided between the abutting faces of the connector housing 330A and the base 200A, and a third seal gap G3 provided between the abutting faces of the base 200A and the cover 400A are filled with waterproof seal materials 501, 502, 503, wherein the first seal gap G1, or the first seal gap G1 and the second seal gap G2, includes a terrace slope portion gap G1b, an outer step flat portion gap G1a and an inner step flat portion gap G1c that are a slit-like space including a pair of terrace slope portions 301b, 401b formed of the connector housing 330A and the cover 400A, a pair of outer step flat portions 301a, 401a in communication with the terrace slope portions and a pair of inner step flat portions 301c, 401c, the outer step flat portions being located on the outer side of the enclosure than the inner step flat portions.

Furthermore, a gap limitation member and a planar movement limitation member are provided between the connector housing 330A and the cover 400A forming the first seal gap G1; the gap limitation member is a gap setting protrusion 304 that is provided on the outer step flat portion 301a, 401a or the inner step flat portion 301c, 401c of one of the connector housing 330A and the cover 400A and that abut the other; the planar movement limitation member includes a pair of opposed members for limiting the relative position of the connector housing 330A such that the gap dimension in the horizontal direction between the terrace slope portions 301b, 401b of the connector housing 330A and the cover 400A falls within a predetermined range, the horizontal direction being parallel to the board surface of the circuit board; and the pair of opposed members include a pair of side face convex threads 352A protruded from the connector housing 330A on the right and left sides and fitting concave threads 450A provided on the cover 400A, the side face convex threads 352A loosely fitting into the fitting concave threads 450A to form a pair of convexo-concave engagement seal faces.

A method for assembling the waterproof control unit of the first embodiment includes: a first processing step 702 in which the base 200A is loaded onto a first jig, then the pasty waterproof seal material 502 is non-annularly applied onto a seal face forming the second seal gap G2 of the base 200A; a second processing step 703c in which the circuit board 300A with the circuit components 311 and the connector housing 330A previously mounted and soldered thereonto is fixedly loaded onto the base, then the connector housing 330A is joined to the base 200A; a third processing step 704 in which the cover 400A is loaded upside down onto a second jig, then the pasty waterproof seal materials 501, 503 are annularly applied onto seal faces forming the first seal gap G1 and the third seal gap G3 of the cover 400A; and a fourth processing step 705 in which the circuit board 300A including the base 200A and the connector housing 330A after the second processing step 703c is oppositely placed on the cover 400A after the third processing step 704, then the cover 400A is fixedly integrated with the base 200A, wherein, as the circuit components 311, the circuit board 300A includes a first heat-generating component 311a mounted on the face opposite the cover 400A or a second heat-generating component 311b mounted on the face opposite the base 200A, and the base 200A includes a first heat transfer pedestal 361a adjacent the rear face of the first heat-generating components 311a or a second heat transfer pedestal 361b adjacent the second heat-generating components 311b, wherein a stage prior to the first processing step 702 includes a preliminary processing step 701b in which pasty heat conductive adhesives 511a, 511b are applied to the surfaces of the first and second heat transfer pedestals 361a, 361b, and wherein, after the fourth processing step 705, the pasty waterproof seal materials 501, 502, 503 and the heat conductive adhesives 511a, 511b are dried and cured at room temperature or high temperature while appearance check and performance check are being performed.

As above, according to this assembly method, the waterproof seal material 502 is applied to the second seal gap face of the base 200A, then the circuit board 300A having the connector housing 330A is fixedly integrated with the base 200A, then the waterproof seal material 502 is annularly applied to the seal face of the cover 400, then the base 200A and the cover 400A are joined to and fixedly integrated with each other, and then appearance check and performance check are performed.

Accordingly, since the bonding is performed immediately after the waterproof seal material 502 is applied, a defective bonding due to dried waterproof seal material does not occur and the abutting condition of the seal faces can be checked from the fitting condition between the positioning fitting holes 440A and the positioning protrusions 340A.

Furthermore, in the third processing step, the waterproof seal materials 501, 503 annularly applied around the cover 400A is applied to a concave thread groove face of the convexo-concave seal faces or a boundary location between the terrace slope portions and the inner step flat portions, which facilitates application work. Note that, when a heat-generating component is mounted on the circuit board 300A, a heat conductive adhesive can be directly applied to a heat transfer pedestal of the base.

Furthermore, the exposed edge face of the connector housing 330A is in a trapezoidal shape; one side face of the cover 400A has a side face opening 100W in a trapezoidal shape with the top side on the upper side; the long-dimensioned bottom side of the trapezoid of the connector housing 330A is positioned by a positioning protruding piece 351 and a board hole 350 to be fixed to one side of the circuit board 300A; part of the connector housing 330A extended beyond the one side of the circuit board 300A is opposite the base 200A with the second seal gap G2 in between to limit the dimension in the horizontal direction of the second seal gap G2; the short-dimensioned top side of the trapezoid of the connector housing 330A is opposite the top side on the upper side of the side face opening 100W of the cover 400A with the first seal gap G1 in between; the pair of side face convex threads 352A, 352A are provided on the right and left hypotenuses of the trapezoid of the connector housing 330A; and the pair of side face convex threads loosely fit into the pair of fitting concave threads 450A, 450A to form convexo-concave engagement seal faces as the pair of opposed members.

As above, relating to a second feature of the invention, the exposed edge face of the connector housing 330A and the side face opening 100W of the cover 400A are in a trapezoidal shape, and the right and left hypotenuses of the trapezoid at which the connector housing 330A abuts the cover 400A form the convexo-concave engagement seal faces functioning as the planar movement limitation member.

Accordingly, the gap dimension of the terrace slope between the connector housing 330A and the cover 400A can be limited by the loosely fitting dimension of the convexo-concave engagement seal faces. Furthermore, on the side faces of the connector housing 330A forming the hypotenuses of the trapezoid, an idle space can be utilized to form the convexo-concave engagement seal faces.

Furthermore, the connector housing 330A includes a partition wall 333 with a plurality of the right-angle type contact terminals 310 press-fit and held therein; and, among the outer step flat portions 301a, 401a, the terrace slope portions 301b, 401b and the inner step flat portions 301c, 401c forming the first seal gap G1, at least part of the inner step flat portions 301c, 401c is extended beyond an inner boundary face 335 of the partition wall 333 to the inside of the enclosure.

As above, relating to a third feature of the invention, among the outer step flat portions 301a, 401a, the terrace slope portions 301b, 401b and the inner step flat portions 301c, 401c forming the first seal gap G1 between the connector housing 330A and the cover 400A, at least part of the inner step flat portions is extended to the inside of the partition wall 333 provided in the connector housing 330A.

Accordingly, by utilizing a surrounding idle space with the contact terminals 310 exposed therein to extend the first seal gap G1, the seal path can be extended to improve waterproof performance or, with the seal path with the same length, the connector housing can be less long-bodied.

Furthermore, between the convexo-concave engagement seal faces formed on the right and left hypotenuses of the trapezoid of the connector housing 330A, the top surfaces of the pair of side face convex threads 352A, 352A protruded from the connector housing 330A are in communication with the boundary portion between the terrace slope portion 301b and the inner step flat portions 301c of the connector housing 330A.

As above, relating to a fourth feature of the invention, the convexo-concave engagement seal faces formed of the pair of side face convex threads 352A, 352A protruded from the connector housing 330A and the fitting concave threads 450A, 450A of the cover loosely fitting to the side face convex threads are in communication with the terrace slope portion 301b and the inner step flat portions 301c of the connector housing 330A. Accordingly, application flow of the waterproof seal material 501 from the hypotenuse portions to the top portion or bottom side portion of the trapezoid can be performed smoothly.

Furthermore, annular peripheral walls 332A are installed upright at the boundary position between the exposed portion and the non-exposed portion of the connector housing 330A. As above, relating to a fifth feature of the invention, the annular peripheral walls 332A are provided in the middle portion of the connector housing 330A. Accordingly, in the stage of assembly processing, the waterproof seal material can be prevented from flowing out of the seal gap formed of the pair of outer step flat portions.

Furthermore, the outer step flat portion gap G1a between the pair of outer step flat portions 301a, 401a is smaller than the inner step flat portion gap G1c between the inner step flat portions 301c, 401c.

As above, relating to a sixth feature of the invention, the outer step slit-like space between the outer step flat portions 301a, 401a positioned outside the seal portions is smaller than the inner step slit-like space between the inner step flat portions 301c, 401c positioned inside the seal portions. Accordingly, the waterproof seal material applied to the seal faces is less likely to flow out of the seal faces but more likely to flow into the seal faces, which allows the slit-like space to be surely filled with the waterproof seal material through optimum dose control of the waterproof seal material.

Furthermore, positioning protrusions 340A functioning as an auxiliary planar movement limitation member are provided on the outer step flat portion 301a of the connector housing 330A, while positioning fitting holes 440A functioning as an auxiliary planar movement limitation member are provided in the outer step flat portion 401a of the cover 400A, the positioning protrusions 340A loosely fitting into the positioning fitting holes 440A.

As above, relating to a seventh feature of the invention, the positioning protrusions 340A and the positioning fitting holes 440A functioning as the auxiliary planar movement limitation member are placed outside the seal portions, and the positioning protrusions 340A are protruded from the connector housing side. Accordingly, the fitting condition between the positioning protrusions 340A and the positioning fitting holes 440A can be visually checked at the stage of assembling the enclosure, and, in operation, water seepage from the positioning fitting holes into the enclosure does not occur.

Furthermore, the positioning protrusions 340A and the positioning fitting holes 440A are provided at least at two locations on the outer step flat portions 301a, 401a of one of the connector housing 330A and the cover 400A; the positioning fitting holes 440A are a circular hole, while the positioning protrusions 340A have an ellipse-shaped cross section; and the major axis lines of the pair of positioning protrusions are inclined such that the major axis lines cross at a location outside the edge face of the connector housing 330A.

As above, relating to a eighth feature of the invention, the plurality of positioning fitting holes 440A and the ellipse-shaped positioning protrusions 340A fitting thereinto are provided to the connector housing 330A and the cover 400A, the major axis lines of the ellipse shapes are inclined in an inverted V shape.

Accordingly, in order to insert/remove the counter-side connecter into/from the plurality of connector pins in the connector housing, when the counter-side connecter is shaken from side to side, the shaking force acting on the connector housing 330A can be allowed to escape to the cover, preventing exfoliation from occurring in the seal faces.

Furthermore, if the positioning protrusions 340A are in a round pin shape and the positioning fitting holes 440A have almost the same diameter, the round pin may not fit into the round hole depending on a dimension error in the pins and holes. However, with the ellipse shape of the positioning protrusions 340A, the tip portion in the ellipse shape is shaved to allow smooth fitting, resulting in fitting without backlash, so the shaking force can be allowed to surely escape to the cover 400A.

Furthermore, the cover 400A is resin-molded using a die; the base 200A is aluminum-molded using a die; the first seal gap G1 is a slit-like space formed of the outer step flat portion gap G1a, the terrace slope portion gap G1b and the inner step flat portion gap G1c; between the connector housing 330A and the cover 400A, the gap setting protrusions 304 functioning as the gap limitation member and the pair of side face convex threads 352A, 352A and the fitting concave threads 450A, 450A functioning as the planar movement limitation member are provided; the second seal gap G2 and the third seal gap G3 are a slit-like space formed of the seal faces with the convexo-concave shaped cross sections engaging with and fitting to each other; in the third seal gap G3, a gap setting abutting face 204 is provided that functions as a gap limitation member for ensuring a predetermined gap dimension when the cover 400A is fixedly tightened to the base 200A; and the gap dimension in the horizontal direction between the terrace slope portions 301b, 401b in the first seal gap G1 is greater than or equal to the loosely fitting dimension between the convexo-concave seal faces in the second seal gap and the third seal gap, accordingly, when the cover 400A is moved to one side, before the terrace slope portions 301b, 401b abut each other, side faces of the convex face and the concave face of the convexo-concave seal faces abut each other to prevent the gap from being too small, while, when the cover 400A is moved to the other side, the gap in the horizontal direction between the terrace slope portions 301b, 401b prevents the other side faces of the convex face and the concave face of the convexo-concave seal faces from abutting each other, thereby preventing the gap from being too large.

As above, relating to a ninth feature of the invention, the first seal gap is made with the terrace slope method and the second and third seal gaps are made with the convexo-concave seal face method; the gap dimension of the first and third seal gaps are determined by the gap setting protrusion and the gap setting abutting face provided in the respective slit-like spaces; and the relative positional relationship between the connector housing 330A and the cover 400A is limited by the planar movement limitation member provided between the connector housing and the cover.

Accordingly, the relative positional relationships between the connector housing 330A and the base 200A and between the cover 400A and the base 200A can be limited by the loosely fitting dimension between the convexo-concave seal faces, and the relative positional relationship between the connector housing and the cover in which an assembly dimension error is likely to occur can be accommodated by the fluctuation margin of the gap dimension in the horizontal direction of the terrace slope portion.

Second Embodiment

A waterproof control unit in accordance with a second embodiment of the invention is described below with reference to FIGS. 8 to 13.

Figure 8:
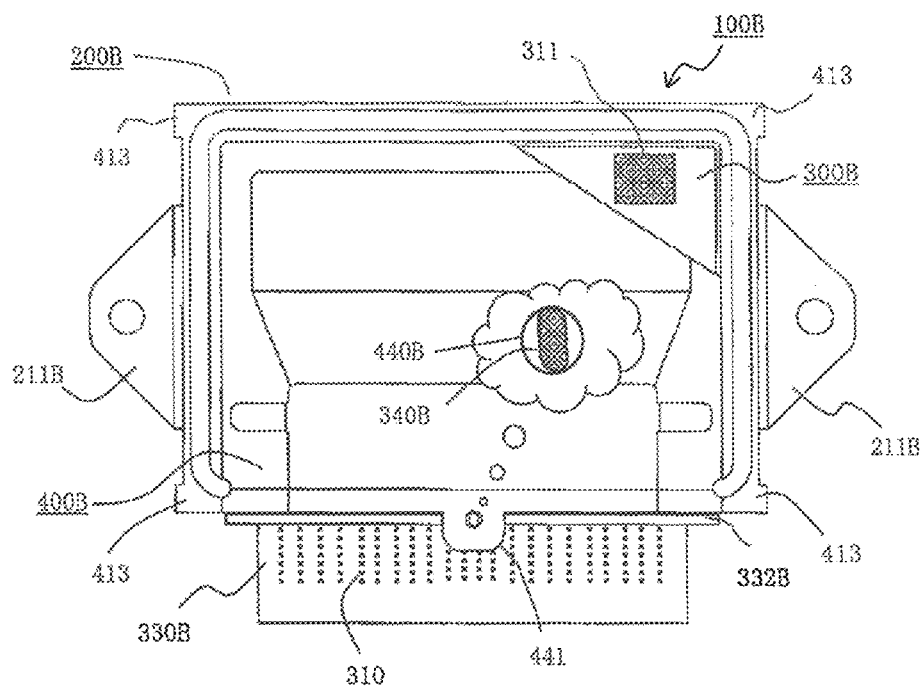
FIG. 8 is a plan view showing a waterproof control unit of a second embodiment of the invention.

In FIG. 8, a waterproof control unit 100B includes: a sheet-metal base 200B having mounting legs 211B, 211B on the right and left sides; a circuit board 300B with circuit components 311 and heat-generating components 311a, 311b described later mounted thereon; and a sheet-metal cover 400B having a flange on the outer periphery wall at three of the sides, in which, on the other one side of the cover 400B, corresponding part of the outer periphery wall includes, in part, a side face opening 100W closed by a connector housing 330B. The circuit board 300B is held between the cover 400B and the base 200B, and the cover 400B and the base 200B are integrated with each other by folding and pressurizing/tightening (fixedly swaging) folding pieces 413 provided at the four corners of the cover 400B.

Figure 10:
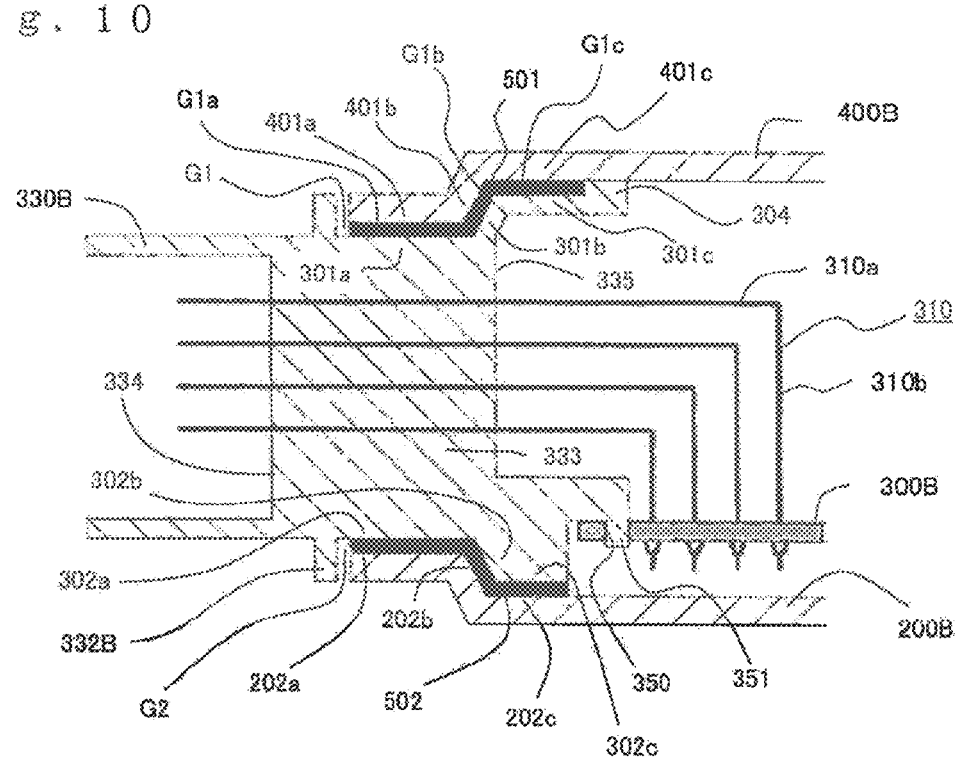
FIG. 10 is a cross-sectional view showing in detail a connector housing part of the waterproof control unit of the second embodiment of the invention.

The connector housing 330B is attached to one side of the circuit board 300B. An annular peripheral wall 332B described later with reference to FIG. 10 is protruded from the outer periphery of the connector housing 330B.

A protruding tongue piece 441 of the cover 400B overhangs a notch of the annular peripheral wall 332B. A positioning protrusion 340B is protruded from the notch of the annular peripheral wall 332B, while a positioning fitting hole 440B is provided in the protruding tongue piece 441 of the cover 400B, the positioning protrusion 340B being configured to fit into the positioning fitting hole 440B.

Figure 9:
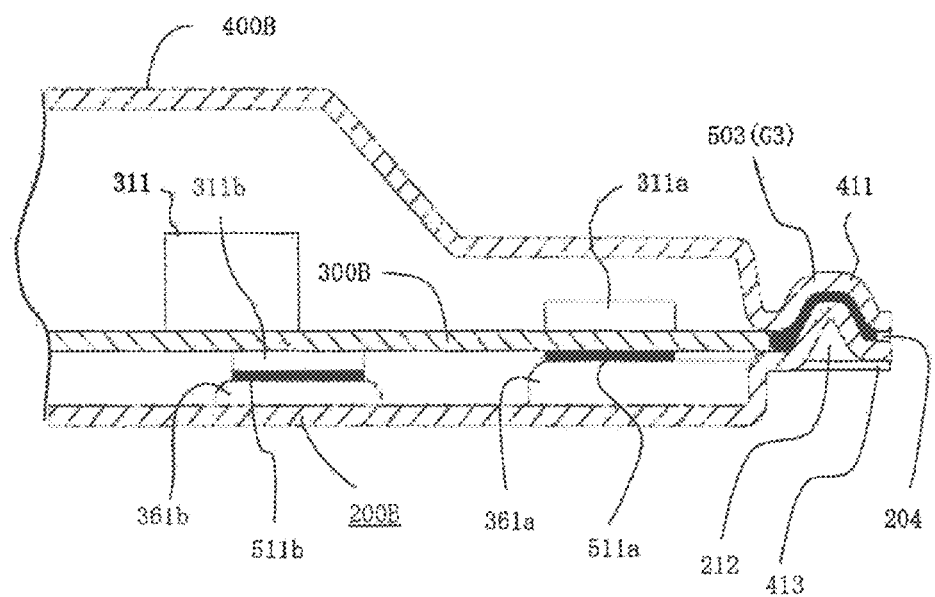
FIG. 9 is a cross-sectional view showing a mounting structure of a circuit board of the waterproof control unit of the second embodiment of the invention.

Note that the positioning fitting hole 440B is a circular hole, while the positioning protrusion 340B has an ellipse-shaped cross section. Then, the positioning fitting hole 440B and the positioning protrusion 340B limit the relative positional relationship between the cover 400B and the connector housing 330B. In FIG. 9, between the opposite faces of the three sides of the outer periphery of the cover 400B and the base 200B, wavy deformed portions 411 provided on the cover 400B and wavy deformed portions 212 provided on the base 200B are engaged with each other to form a third seal gap G3 and convexo-concave seal faces with a waterproof seal material 503 applied thereto.

As described above, the cover 400B and the base 200B are fixed to each other by swaging the folding pieces 413 provided at the four corners of the cover 400B. At this time, the cover 400B and the base 200B abut a gap setting abutting face 204 to determine the gap dimension of the third seal gap G3 with the waterproof seal material 503 applied thereto. The circuit board 300B includes: the first heat-generating component 311a mounted on the board surface on the cover 400B side; and the second heat-generating component 311b mounted on the board surface on the base 200B side. The base 200B includes: a first heat transfer pedestal 361a adjacent to the bottom surface of the first heat-generating component 311a; and a second heat transfer pedestal 361b adjacent to the rear surface of the second heat-generating component 311b, in which heat conductive adhesives 511a, 511b are applied to the surfaces of the first and second heat transfer pedestals 361a, 361b.

Note that, according to the above description, the circuit board 300B is held between the cover 400B and the base 200B, however, the circuit board 300B may be fixed to a plurality of fixing pedestals not shown provided on the inner surface of the base 200B by tightening a plurality of fixing screws. Alternatively, the cover 400B and the base 200B may be fixed to each other by tightening a fixing screw not shown instead of fixedly swaging the folding pieces 413.

In FIG. 10, the connector housing 330B includes: the annular peripheral wall 332B described above with reference to FIG. 8; and a partition wall 333 with a right-angle type contact terminal 310 press-fit thereinto. A counterpart connector not shown is inserted into the outside of an outer boundary face 334 of the partition wall 333, then a counterpart contact terminal to be in contact and electrical communication with one end of the contact terminal 310 is inserted. The contact terminal 310 has a horizontal portion 310a and a vertical portion 310b that are exposed inside an inner boundary face 335 of the partition wall 333, the tip of the vertical portion 310b passing through the circuit board 300B and being connected to the rear side by soldering. Note that when the vertical portion 310b of the contact terminal 310 expands or contracts due to change in environmental temperature, the horizontal portion 310a bends to prevent the solder connection to the circuit board 300B from being damaged. When the horizontal portion 310a of the contact terminal 310 expands or contracts due to change in environmental temperature, the vertical portion 310b bends to prevent the press-fit portion of the partition wall 333 from being stressed.

Furthermore, a board hole 350 is provided on both sides of the left side (on the opening side) of the circuit board 300B. Then, a positioning protruding piece 351 (e.g., a snap pin) press-fit into the connector housing 330B fits into the board hole to limit the mounting position of the connector housing 330B relative to that of the circuit board 300B. In the left side opening of the cover 400B at which part of the connector housing 330B is exposed, an outer step flat portion 401a, a terrace slope portion 401b and an inner step flat portion 401c are provided, opposite to an outer step flat portion 301a, a terrace slope portion 301b and an inner step flat portion 301c on the connector housing 330B, to form a first seal gap G1 (an outer step flat portion gap G1a, a terrace slope portion gap G1b and an inner step flat portion gap G1c) with a waterproof seal material 501 applied thereto. Note that the waterproof seal material 501 is applied beyond the inner boundary face 335 of the partition wall 333.

Furthermore, a plurality of gap setting protrusions 304 are protruded from the inner edge face of the inner step flat portion 301c of the connector housing 330B. The gap setting protrusions 304 abut the inner face of the cover 400B to prevent the first seal gap G1 from being too small. The gap setting protrusions 304 may also be provided on the inner face side of the cover 400B or may also be provided at the outer step flat portion 301a of the connector housing 330B or the outer step flat portion 401a of the cover 400B.

Figure 11:
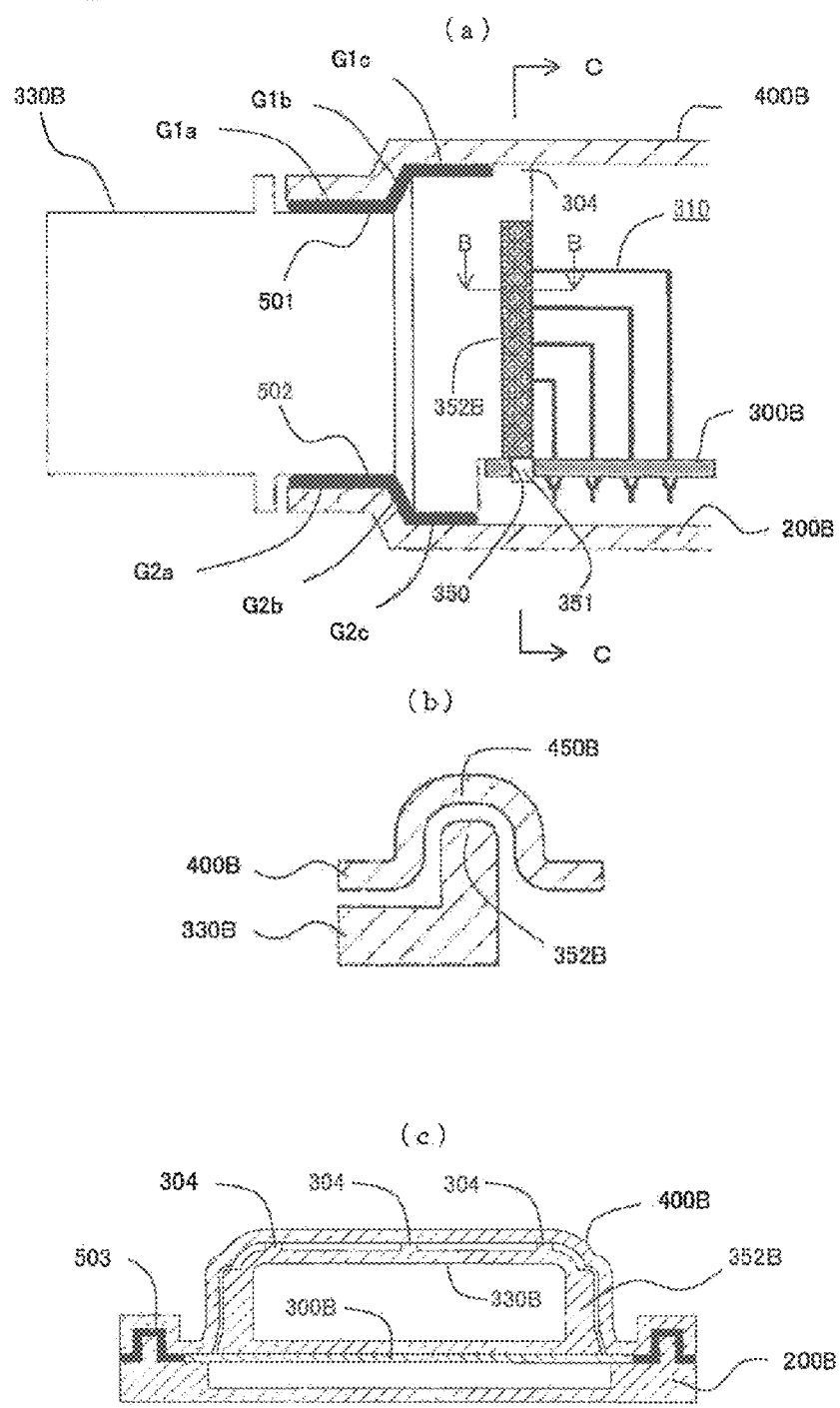
FIG. 11 illustrates a planar movement limitation member of the second embodiment of the invention in which (a) is a cross-sectional view viewing from the side face, (b) is a cross-sectional view taken along the line B-B in FIG. 11(a) viewing in the arrow direction, and (c) is a cross-sectional view taken along the line C-C in FIG. 11(a) viewing in the arrow direction.

On the left side (the opening side) of the base 200B opposite the connector housing 330B, an outer step flat portion 202a, a terrace slope portion 202b and an inner step flat portion 202c are provided, opposite to an outer step flat portion 302a, a terrace slope portion 302b and an inner step flat portion 302c on the connector housing 330B, to form a second seal gap G2 (an outer step flat portion gap G2a, a terrace slope portion gap G2b and an inner step flat portion gap G2c similar to the first seal gap G1 of the first embodiment, see FIG. 11) with a waterproof seal material 502 applied thereto. Note that the waterproof seal material 502 is applied beyond the inner boundary face 335 of the partition wall 333, as with the first embodiment.

Furthermore, a plurality of gap setting protrusions 304 not shown are protruded from the inner edge face of the inner step flat portion 302c of the connector housing 330B. The gap setting protrusions 304 abut the inner face of the base 200B to prevent the second seal gap G2 from being too small. The gap setting protrusions 304 may also be provided on the inner face side of the base 200B or may also be provided at the outer step flat portion 302a of the connector housing 330B or the outer step flat portion 202a of the base 200B. However, for the second seal gap G2, the gap may also be limited by the height of the mounting face of the circuit board 300B and the base 200B, in which the gap setting protrusions 304 for the second seal gap G2 may also be omitted. The dimensions of the portions of the first and second seal gaps G1, G2 are configured such that the gap dimension between the outer step flat portions is smaller than the gap dimension between the inner step flat portions so that the applied waterproof seal materials 501, 502 are less likely to flow to the outside but more likely to flow to the inside.

Next, a planar movement limitation member of the second embodiment of the invention is described with reference to FIG. 11. In FIGS. 11(a), 11(b) and 11(c), the exposed edge face of the connector housing 330B is in a trapezoidal shape; and on the right and left hypotenuses of the trapezoid of the connector housing 330B, a pair of side face convex threads 352B, 352B protruded from the connector housing 330B on the right and left sides (front and rear sides in FIG. 11(a)

when the page is viewed) and fitting concave threads 450B, 450B of the cover 400B that loosely fit to the side face convex threads form a pair of convexo-concave engagement faces on the right and left sides, the pair of side face convex threads 352B, 352B and the fitting concave threads 450B, 450B functioning as a planar movement limitation member for limiting a relative movement between the connector housing 330B and the cover 400B.

Note that, even when the loosely fitting dimension between the side face convex threads 352B and the fitting concave threads 450B is set to be small so that they function as a main planar movement limitation member, the fitting condition between the positioning protrusions 340B and the positioning fitting holes 440B in FIG. 8 can be visually checked to determine whether or not an abnormality exists in the relative positional relationship among the cover 400B, the connector housing 330B and the base 200B.

Figure 12:
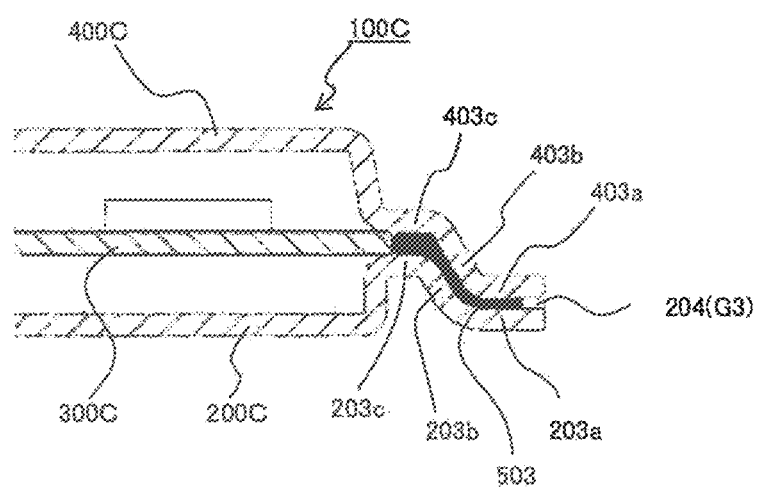
FIG. 12 is a detailed partial cross-sectional view of a variation of the second embodiment of the invention.

Next, another variation of what is shown in FIG. 8 is described with reference to FIG. 12. In FIG. 12, a cover 400C included in a waterproof control unit 100C includes an outer step flat portion 403a, a terrace slope portion 403b and an inner step flat portion 403c for forming a third seal gap G3 similar to the first seal gap G1 of the first embodiment, and a base 200C includes an outer step flat portion 203a, a terrace slope portion 203b and an inner step flat portion 203c for forming the third seal gap G3, the base 200C including a gap setting abutting face 204.

Accordingly, in comparison with what is shown in FIG. 9, the method for the third seal gap G3 is changed from the wavy convexo-concave seal face method to the terrace slope method; the waterproof seal material 503 is applied to the terrace slope portion; and the application thickness is determined by the height dimension of the gap setting abutting face 204. Note that the rest of the cover 400C and the base 200C is similar to that of the cover 400B and the base 200B.

Next, an assembly process of the waterproof control unit according to the second embodiment of the invention is described with reference to a flowchart in FIG. 13. In FIG. 13, a step 800 is a starting step of the assembly work of the waterproof control unit 100B, however, preparation steps 803a, 803b and 805a precede the starting step 800.

In the preparation step 803a, the plurality of contact terminals 310 are fixedly press-fit into the partition wall 333 of the connector housing 330B, and the positioning protruding piece 351 (e.g., a snap) is press-fit into the connector housing 330B and fixedly fit into the board hole 350 of the circuit board 300B.

In the preparation step 803b, the heat-generating components 311a, 311b and the plurality of circuit components 311 are mounted and soldered onto the circuit board 300B, and one ends of the contact terminals 310 are soldered into lands provided on the circuit board 300B to complete an "intermediate assembly of circuit board." In the preparation step 805a, a ventilation filter not shown is fixedly bonded to the inner bottom surface of the base 200B with an adhesive.

In a step 801 following the starting step 800, the cover 400B is loaded upside down onto an assembly jig. A next step 802 is a first processing step in which the waterproof seal material 501 is applied onto the first seal gap face of the cover 400B.

A next step 803c is a second processing step in which the "intermediate assembly of circuit board" having been completed in the preparation step 803b is loaded onto the internal surface of the cover 400B, then the waterproof seal material 501 having been applied in the step 802 is bonded to the counter face.

Also, as an additional processing step included in the second processing step, the heat conductive adhesives 511a, 511b are applied to the rear surface of the circuit board 300B at which the heat-generating component 311a is mounted onto the top surface and to the surface of the heat-generating component 311b.

A next step 804 is a third processing step in which the pasty waterproof seal materials 502, 503 are applied by an annular route to the third seal gap face of the cover 400B and the second seal gap face of the connector housing 330B.

A next step 805b is a fourth processing step in which the base 200B to which the ventilation filter has been fixedly bonded in the preparation step 805a is loaded upside down onto the cover 400B, then the heat conductive adhesives 511a, 511b and the waterproof seal materials 502, 503 having been applied in the steps 803c and 804 are bonded to the counter face, and then the cover 400B is fixedly integrated with the base 200B by swaging members or screws.

In a next step 806, initial setting, performance check and appearance check of the waterproof control unit 100B is performed while the heat conductive adhesives 511a, 511b and the waterproof seal materials 501, 502, 503, having been applied in the steps 803c and 804, are dried at room temperature or excessively high temperature, then the process proceeds to an overall assembly completion step 807.

Note that, as the appearance check, the fitting condition between a positioning fitting hole not shown provided in the base 200B and a positioning protrusions not shown provided on the connector housing 330B is checked, then, through visual determination by comparison with a standard sample or automatic determination by image recognition, it is determined whether or not the relative positional relationship among the cover 400B, the connector housing 330B and the base 200B is correct.

However, with an electronic camera provided on the rear face of the die that is configured to image the fitting condition between the positioning fitting hole 440B and the positioning protrusion 340B on the cover 400B side to be enlargedly displayed on a screen, even when a positioning fitting hole and a positioning protrusion are not provided on the base 200B side, the fitting condition can be constantly monitored. Alternatively, as appearance check by sampling, the fitting condition between the positioning fitting hole 440B provided in the cover 400B and the positioning protrusion 340B provided on the connector housing 330B can be checked, then, through visual determination by comparison with a standard sample or automatic determination by image recognition, it can be determined whether or not the relative positional relationship among the cover 400B, the connector housing 330B and the base 200B is correct. In this way, a change in the relative positional relationship among the cover 400B, the connector housing 330B and the base 200B depending on the production lot is observed to determine whether or not a difference exists between the production lots and determine whether or not an unintended change has occurred. Note that transfer operation between the steps other than sampling inspection, application processing of heat conductive adhesive and waterproof seal material, screw tightening and the like are all performed automatically, and optimum dose control is performed so that excess or deficiency in the amount of heat conductive adhesive and waterproof seal material will not occur. This also applies to the waterproof control unit 100C.

Features and effects of the second embodiment are described below. As seen from the above description, the first feature of the second embodiment of the invention is a waterproof control unit 100B, 100C in which: a circuit board 300B, 300C is fixedly contained in an enclosure formed of a base 200B, 200C and a cover 400B, 400C; a plurality of circuit components 311 and a resin-molded connector housing 330B are fixedly positioned on the circuit board; in order to expose outside the enclosure the edge face of the connector housing 330B with a plurality of contact terminals 310 for external connection fixed therethrough, a first seal gap G1 provided between the abutting faces of the connector housing 330B and the cover 400B, 400C, a second seal gap G2 provided between the abutting faces of the connector housing 330B and the base 200B, 200C, and a third seal gap G3 provided between the abutting faces of the base 200B, 200C and the cover 400B, 400C are filled with waterproof seal materials 501, 502, 503, wherein the first seal gap G1 and the second seal gap G2 includes a terrace slope portion gap G1b, G2b, an outer step flat portion gap G1a, G2a and an inner step flat portion gap G1c, G2c that are a slit-like space including a pair of terrace slope portions 301b, 401b, 302b, 202b formed of the connector housing 330B, the cover 400B, 400C and the base 200B, 200C, a pair of outer step flat portions 301a, 401a, 302a, 202a in communication with the terrace slope portions and a pair of inner step flat portions 301c, 401c, 302c, 202c, the outer step flat portions being located on the outer side of the enclosure than the inner step flat portions.

Furthermore, a gap limitation member and a planar movement limitation member are provided between the connector housing 330B and the cover 400B and 400C forming the first seal gap G1; the gap limitation member is a gap setting protrusion 304 that is provided on the outer step flat portion 301a, 401a or the inner step flat portion 301c, 401c of one of the connector housing 330B and the cover 400B, 400C and that abut the other; the planar movement limitation member includes a pair of opposed members for limiting the relative position of the connector housing 330B such that the gap dimension in the horizontal direction between the terrace slope portions 301b, 401b of the connector housing 330B and the cover 400B, 400C falls within a predetermined range, the horizontal direction being parallel to the board surface of the circuit board; and the pair of opposed members include a pair of side face convex threads 352B protruded from the connector housing 330B on the right and left sides and fitting concave threads 450B provided on the cover 400B, 400C, the side face convex threads 352B loosely fitting into the fitting concave threads 450B to form a pair of convexo-concave engagement seal faces.

A method for assembling the waterproof control unit of the second embodiment includes: a first processing step 802 in which the cover 400B, 400C is loaded upside down onto a jig, then the pasty waterproof seal material 501 is non-annularly applied onto a seal face forming the first seal gap G1 of the cover 400B, 400C; a second processing step 803c in which the circuit board 300B, 300C with the circuit components 311 and the connector housing 330B previously mounted and soldered thereonto is loaded onto a terrace step portion provided on the three sides of the outer periphery of the cover 400B, 400C, then the connector housing 330B is joined to the cover 400B, 400C; a third processing step 804 in which the pasty waterproof seal materials 503, 502 are annularly applied onto seal faces forming the third seal gap G3 of the cover 400B, 400C after the second processing step 803c and the second seal gap G2 of the connector housing 330B; and a fourth processing step 805b in which the base 200B, 200C is loaded onto the cover 400B, 400C after the third processing step 804, then the cover 400B, 400C is fixedly integrated with the base 200B, 200C, and then the circuit board 300B, 300C is fixedly held between the base 200B, 200C and cover 400B, 400C on the three sides of the outer periphery, wherein, as the circuit components 311, the circuit board 300B, 300C includes a first heat-generating component 311a mounted on the face opposite the cover 400B, 400C or a second heat-generating component 311b mounted on the face opposite the base 200B, 200C, and the base 200B, 200C includes a first heat transfer pedestal 361a adjacent the rear face of the first heat-generating components 311a or a second heat transfer pedestal 361b adjacent the second heat-generating components 311b, the second processing step 803c includes an additional processing step in which the pasty heat conductive adhesives 511a, 511b are applied to the surface of the circuit board 300B, 300C at a location corresponding to the first or second heat transfer pedestal 361a, 361b, and wherein, after the fourth processing step 805b, the pasty waterproof seal materials 501, 502, 503 and the heat conductive adhesives 511a, 511b are dried and cured at room temperature or high temperature while appearance check and performance check are being performed.

As above, according to this assembly method, the waterproof seal material is applied to the seal face forming the first seal gap G1 of the cover 400B, then the circuit board 300B having the connector housing 330B is loaded onto the cover 400B, then the waterproof seal material 502 is annularly applied to the seal faces forming the third seal gap G3 of the cover and the second seal gap G2 of the connector housing, then the base and the cover are joined to and fixedly integrated with each other, and then appearance check and performance check are performed.

Accordingly, since the bonding is performed immediately after the waterproof seal material is applied, a defective bonding due to dried waterproof seal material does not occur and the abutting condition of the seal faces can be checked from the fitting condition between the positioning fitting holes 440B and the positioning protrusions 340B.

Furthermore, in the third processing step, the waterproof seal materials annularly applied around the cover and the connector housing is applied to a concave thread groove face of the convexo-concave seal faces or a boundary location between the terrace slope portions and the inner step flat portions, which facilitates application work. Furthermore, all of the assembly steps is performed using one jig, then the step of fixedly screwing the circuit board 300B, 300C onto the base 200B, 200C can be omitted.

Furthermore, the exposed edge face of the connector housing 330B is in a trapezoidal shape; one side face of the cover 400B, 400C has a side face opening 100W in a trapezoidal shape with the top side on the upper side; the long-dimensioned bottom side of the trapezoid of the connector housing 330B is positioned by a positioning protruding piece 351 and a board hole 350 to be fixed to one side of the circuit board 300B, 300C; part of the connector housing 330B extended beyond the one side of the circuit board 300B, 300C is opposite the base 200B, 200C with the second seal gap G2 in between to limit the dimension in the horizontal direction of the second seal gap G2; the short-dimensioned top side of the trapezoid of the connector housing 330B is opposite the top side on the upper side of the side face opening 100W of the cover 400B, 400C with the first seal gap G1 in between; the pair of side face convex threads 352B, 352B are provided on the right and left hypotenuses of the trapezoid of the connector housing 330B; and the pair of side face convex threads loosely fit into the pair of fitting concave threads 450B, 450B to form convexo-concave engagement seal faces as the pair of opposed members.

As above, relating to the second feature of the invention, the exposed edge face of the connector housing 330B and the side face opening 100W of the cover are in a trapezoidal shape, and the right and left hypotenuses of the trapezoid at which the connector housing 330B abuts the cover 400B form the convexo-concave engagement seal faces functioning as the planar movement limitation member.

Accordingly, the gap dimension of the terrace slope between the connector housing and the cover can be limited by the loosely fitting dimension of the convexo-concave engagement seal faces.

Furthermore, on the side faces of the connector housing forming the hypotenuses of the trapezoid, an idle space can be utilized to form the convexo-concave engagement seal faces.

Furthermore, the connector housing 330B includes a partition wall 333 with a plurality of the right-angle type contact terminals 310 press-fit and held therein; and, among the outer step flat portions 301a, 401a, the terrace slope portions 301b, 401b and the inner step flat portions 301c, 401c forming the first seal gap G1, at least part of the inner step flat portions 301c, 401c is extended beyond an inner boundary face 335 of the partition wall 333 to the inside of the enclosure.

As above, relating to the third feature of the invention, among the outer step flat portions, the terrace slope portions and the inner step flat portions forming the first seal gap between the connector housing 330B and the cover, at least part of the inner step flat portions is extended to the inside of the partition wall 333 provided in the connector housing.

Accordingly, by utilizing a surrounding idle space with the contact terminals 310 exposed therein to extend the first seal gap G1, the seal path can be extended to improve waterproof performance or, with the seal path with the same length, the connector housing can be less long-bodied.

Furthermore, annular peripheral walls 332B are installed upright at the boundary position between the exposed portion and the non-exposed portion of the connector housing 330B.

As above, relating to the fifth feature of the invention, the annular peripheral walls 332B are provided in the middle portion of the connector housing 330B.

Accordingly, in the stage of assembly processing, the waterproof seal material can be prevented from flowing out of the seal gap formed of the pair of outer step flat portions.

Furthermore, the outer step flat portion gap G1a, G2a between the pair of outer step flat portions 301a, 401a, 302a, 202a is smaller than the inner step flat portion gap G1c, G2c between the inner step flat portions 301c, 401c, 302c, 202c.

As above, relating to the sixth feature of the invention, the outer step slit-like space between the outer step flat portions 301a, 401a, 302a, 202a positioned outside the seal portions is smaller than the inner step slit-like space between the inner step flat portions 301c, 401c, 302c, 202c positioned inside the seal portions.

Accordingly, the waterproof seal material applied to the seal faces is less likely to flow out of the seal faces but more likely to flow into the seal faces, which allows the slit-like space to be surely filled with the waterproof seal material through optimum dose control of the waterproof seal material.

Furthermore, positioning protrusion 340B functioning as an auxiliary planar movement limitation member is provided on the outer step flat portions 301a, 302a of the connector housing 330B, while positioning fitting hole 440B functioning as an auxiliary planar movement limitation member is provided in the outer step flat portions 401a, 202a of the cover 400B, 400C or the base 200B, 200C, the positioning protrusion 340B loosely fitting into the positioning fitting hole 440B.

As above, relating to the seventh feature of the invention, the positioning protrusion 340B and the positioning fitting hole 440B functioning as the auxiliary planar movement limitation member are placed outside the seal portions, and the positioning protrusion 340B is protruded from the connector housing side.

Accordingly, the fitting condition between the positioning protrusion 340B and the positioning fitting hole 440B can be visually checked at the stage of assembling the enclosure, and, in operation, water seepage from the positioning fitting hole into the enclosure does not occur.

Furthermore, the cover 400B, 400C and the base 200B, 200C are made by pressing a sheet metal; the seal gap of both the first seal gap G1 and the second seal gap G2 is a slit-like space formed of the outer step flat portion gap G1a, G2a, the terrace slope portion gap G1b, G2b and the inner step flat portion gap G1c, G2c, respectively; between the connector housing 330B and the cover 400B, 400C forming the first seal gap G1, the gap setting protrusions 304 functioning as the gap limitation member and the pair of side face convex threads 352B, 352B and the fitting concave threads 450B, 450B functioning as the planar movement limitation member are provided; the relative positional relationship between the connector housing 330B and the base 200B, 200C forming the second seal gap G2 is determined by the assembling accuracy between the circuit board 300B, 300C and the base 200B, 200C; the third seal gap G3 is a slit-like space provided on the three sides of the outer periphery of the cover 400B, 400C and the base 200B, 200C in which a pair of wavy deformed portions 411, 212 are opposite to each other or a slit-like space formed of a pair of terrace slope portions 403b, 203b, a pair of outer step flat portions 403a, 203a in communication with the terrace slope portions, and a pair of inner step flat portions 403c, 203c, the slit-like space including a gap setting abutting face 204 functioning as a gap limitation member to ensure a predetermined gap dimension when the cover 400B, 400C is fixedly screwed onto the base 200B, 200C.

As above, relating to the tenth feature of the invention, the gap dimension of at least the first and third seal gaps is determined by the gap setting protrusion 304 and the gap setting abutting face 204 provided in the respective slit-like spaces; the relative positional relationship between the connector housing 330B and the cover 400B, 400C is positioned by the planar movement limitation member provided in the first seal gap G1; and the relative positional relationship between the connector housing 330B and the base 200B, 200C is limitedly positioned by the circuit board 300B, 300C in between.

Accordingly, variation in the gap dimension of the first and third seal gaps and in the gap dimension in the direction parallel to the board surface in the terrace slope portion due to variation in assembling accuracy can be reduced, and the gap dimension between the connector housing 330B and the cover 400B, 400C prone to an assembly dimension error can be directly limited by the planar movement limitation member provided in the first seal gap G1 to ensure an adequate seal face.

Note that according to the invention, the embodiments may be appropriately modified or omitted within the scope of the invention.

Various modifications and alterations of this invention will be apparent to those skilled in the art without departing from the scope and spirit of this invention, and it should be understood that this is not limited to the illustrative embodiments set forth herein.

REFERENCE SIGNS LIST

- 100A, 100B, 100C: waterproof control unit
- 100W: side face opening
- 200A, 200B, 200C: base
- 202a, 203a: outer step flat portion
- 202b, 203b: terrace slope portion
- 202c, 203c: inner step flat portion
- 204: gap setting abutting face
- 212: wavy deformed portion (third seal gap)
- 300A, 300B, 300C: circuit board
- 301a, 302a: outer step flat portion
- 301b, 302b: terrace slope portion
- 301c, 302c: inner step flat portion
- 304: gap setting protrusion
- 310: contact terminal
- 311: circuit component
- 311a, 311b: first and second heat-generating components
- 330A, 330B: connector housing
- 332A (332a, 332b), 332B: annular peripheral wall
- 333 (333a, 333b): partition wall
- 335 (335a, 335b): inner boundary face
- 340A (340a, 340b): positioning protrusion
- 340B: positioning protrusion
- 350: board hole
- 351: positioning protruding piece
- 352A, 352B: side face convex thread
- 361a, 361b: first and second heat transfer pedestals
- 400A, 400B, 400C: cover
- 401a, 403a: outer step flat portion
- 401b, 403b: terrace slope portion
- 401c, 403c: inner step flat portion
- 411: wavy deformed portion (third seal gap)
- 440A (440a, 440b), 440B: positioning fitting hole
- 450A, 450B: fitting concave thread
- 501, 502, 503: waterproof seal material
- 511a, 511b: heat conductive adhesive
- G1: first seal gap
- G2: second seal gap
- G3: third seal gap
- G1a, G2a: outer step flat portion gap
- G1b, G2b: terrace slope portion gap
- G1c, G2c: inner step flat portion gap

What is claimed is:

1. A waterproof control unit in which: a circuit board is fixedly contained in an enclosure formed of a base and a cover; a plurality of circuit components and a resin-molded connector housing are fixedly positioned on the circuit board; in order to expose outside the enclosure the edge face of the connector housing with a plurality of contact terminals for external connection fixed therethrough, a first seal gap provided between the abutting faces of the connector housing and the cover, a second seal gap provided between the abutting faces of the connector housing and the base, and a third seal gap provided between the abutting faces of the base and the cover are filled with waterproof seal materials, wherein the first seal gap, or the first seal gap and the second seal gap, includes a terrace slope portion gap, an outer step flat portion gap and an inner step flat portion gap that are a slit-like space including a pair of terrace slope portions formed of the connector housing and the cover or the base, a pair of outer step flat portions in communication with the terrace slope portions and a pair of inner step flat portions, the outer step flat portions being located on the outer side of the enclosure than the inner step flat portions, wherein a gap limitation member and a planar movement limitation member are provided between the connector housing and the cover forming the first seal gap, wherein the gap limitation member is a gap setting protrusion that is provided on the outer step flat portions or the inner step flat portions of one of the connector housing and the cover and that abuts the other, wherein the planar movement limitation member includes a pair of opposed members for limiting the relative position of the connector housing such that the gap dimension in the horizontal direction between the terrace slope portions of the connector housing and the cover falls within a predetermined range, the horizontal direction being parallel to the board surface of the circuit board, and wherein the pair of opposed members include a pair of side face convex threads protruded from the connector housing on the right and left sides and fitting concave threads provided on the cover, the side face convex threads loosely fitting into the fitting concave threads to form a pair of convexo-concave engagement seal faces.

2. The waterproof control unit according to claim 1,
wherein the exposed edge face of the connector housing is in a trapezoidal shape, and one side face of the cover has a side face opening in a trapezoidal shape with the top side on the upper side, wherein the long-dimensioned bottom side of the trapezoid of the connector housing is positioned by a positioning protruding piece and a board hole to be fixed to one side of the circuit board, and part of the connector housing extended beyond the one side of the circuit board is opposite the base with the second seal gap in between to limit the dimension in the horizontal direction of the second seal gap, wherein the short-dimensioned top side of the trapezoid of the connector housing is opposite the top side on the upper side of the side face opening of the cover with the first seal gap in between, and wherein the pair of side face convex threads are provided on the right and left hypotenuses of the trapezoid of the connector housing, and the pair of side face convex threads loosely fit into the pair of fitting concave threads to form convexo-concave engagement seal faces as the pair of opposed members.

3. The waterproof control unit according to claim 2,
wherein the connector housing includes a partition wall with a plurality of the right-angle type contact terminals press-fit and held therein, and wherein, among the outer step flat portions, the terrace slope portions and the inner step flat portions forming the first seal gap, at least part of the inner step flat portions is extended beyond an inner boundary face of the partition wall to the inside of the enclosure.

4. The waterproof control unit according to claim 2,
wherein, between the convexo-concave engagement seal faces formed on the right and left hypotenuses of the trapezoid of the connector housing, the top surfaces of the pair of side face convex threads protruded from the connector housing are in communication with the boundary portion between the terrace slope portion and the inner step flat portions of the connector housing.

5. The waterproof control unit according to claim 2, wherein annular peripheral walls are installed upright at the boundary position between the exposed portion and the non-exposed portion of the connector housing.

6. The waterproof control unit according to claim 3, wherein annular peripheral walls are installed upright at the boundary position between the exposed portion and the non-exposed portion of the connector housing.

7. The waterproof control unit according to claim 2, wherein the outer step flat portion gap between the pair of outer step flat portions is smaller than the inner step flat portion gap between the inner step flat portions.

8. The waterproof control unit according to claim 3, wherein the outer step flat portion gap between the pair of outer step flat portions is smaller than the inner step flat portion gap between the inner step flat portions.

9. The waterproof control unit according to claim 2,
wherein positioning protrusions functioning as an auxiliary planar movement limitation member are provided on the outer step flat portions of the connector housing, and
wherein positioning fitting holes functioning as an auxiliary planar movement limitation member are provided in the outer step flat portions of the cover or the base, the positioning protrusions loosely fitting into the positioning fitting holes.

10. The waterproof control unit according to claim 3,
wherein positioning protrusions functioning as an auxiliary planar movement limitation member are provided on the outer step flat portions of the connector housing, and
wherein positioning fitting holes functioning as an auxiliary planar movement limitation member are provided in the outer step flat portions of the cover or the base, the positioning protrusions loosely fitting into the positioning fitting holes.

11. The waterproof control unit according to claim 9,
wherein the positioning protrusions and the positioning fitting holes are provided at least at two locations on the outer step flat portions of one of the connector housing and the cover or the base, and
wherein the positioning fitting holes are a circular hole, while the positioning protrusions have an ellipse-shaped cross section, and the major axis lines of the pair of positioning protrusions are inclined such that the major axis lines cross at a location outside the edge face of the connector housing.

12. The waterproof control unit according to claim 10,
wherein the positioning protrusions and the positioning fitting holes are provided at least at two locations on the outer step flat portions of one of the connector housing and the cover or the base, and
wherein the positioning fitting holes are a circular hole, while the positioning protrusions have an ellipse-shaped cross section, and the major axis lines of the pair of positioning protrusions are inclined such that the major axis lines cross at a location outside the edge face of the connector housing.

13. The waterproof control unit according to claim 2,
wherein the cover is resin-molded using a die, and the base is aluminum-molded using a die,
wherein the first seal gap is a slit-like space formed of the outer step flat portion gap, the terrace slope portion gap and the inner step flat portion gap,
wherein, between the connector housing and the cover, the gap setting protrusions functioning as the gap limitation member and the pair of side face convex threads and the fitting concave threads functioning as the planar movement limitation member are provided,
wherein the second seal gap and the third seal gap are a slit-like space formed of the seal faces with the convexo-concave shaped cross sections engaging with and fitting to each other, and, in the third seal gap, a gap setting abutting face is provided that functions as a gap limitation member for ensuring a predetermined gap dimension when the cover is fixedly tightened to the base, and
wherein the gap dimension in the horizontal direction between the terrace slope portions in the first seal gap is greater than or equal to the loosely fitting dimension between the convexo-concave seal faces in the second seal gap and the third seal gap, accordingly, when the cover is moved to one side, before the terrace slope portions abut each other, side faces of the convex face and the concave face of the convexo-concave seal faces abut each other to prevent the gap from being too small, while, when the cover is moved to the other side, the gap in the horizontal direction between the terrace slope portions prevents the other side faces of the convex face and the concave face of the convexo-concave seal faces from abutting each other, thereby preventing the gap from being too large.

14. The waterproof control unit according to claim 3,
wherein the cover is resin-molded using a die, and the base is aluminum-molded using a die,
wherein the first seal gap is a slit-like space formed of the outer step flat portion gap, the terrace slope portion gap and the inner step flat portion gap,
wherein, between the connector housing and the cover, the gap setting protrusions functioning as the gap limitation member and the pair of side face convex threads and the fitting concave threads functioning as the planar movement limitation member are provided,
wherein the second seal gap and the third seal gap are a slit-like space formed of the seal faces with the convexo-concave shaped cross sections engaging with and fitting to each other, and, in the third seal gap, a gap setting abutting face is provided that functions as a gap limitation member for ensuring a predetermined gap dimension when the cover is fixedly tightened to the base, and
wherein the gap dimension in the horizontal direction between the terrace slope portions in the first seal gap is greater than or equal to the loosely fitting dimension between the convexo-concave seal faces in the second seal gap and the third seal gap, accordingly, when the cover is moved to one side, before the terrace slope portions abut each other, side faces of the convex face and the concave face of the convexo-concave seal faces abut each other to prevent the gap from being too small, while, when the cover is moved to the other side, the gap in the horizontal direction between the terrace slope portions prevents the other side faces of the convex face and the concave face of the convexo-concave seal faces from abutting each other, thereby preventing the gap from being too large.

15. The waterproof control unit according to claim 2,
wherein the cover and the base are made by pressing a sheet metal,
wherein the seal gap of both the first seal gap and the second seal gap is a slit-like space formed of the outer step flat portion gap, the terrace slope portion gap and the inner step flat portion gap, respectively, wherein, between the connector housing and the cover forming the first seal gap, the gap setting protrusions functioning as the gap limitation member and the pair of side face convex threads and the fitting concave threads functioning as the planar movement limitation member are provided, wherein the relative positional relationship between the connector housing and the base forming the second seal gap is determined by the assembling accuracy between the circuit board and the base, and wherein the third seal gap is a slit-like space provided on the three sides of the outer periphery of the cover and the base in which a pair of wavy deformed portions are opposite to each other or a slit-like space formed of a pair of terrace slope portions, a pair of outer step flat portions in communication with the terrace slope portions, and a pair of inner step flat portions, the slit-like space including a gap setting abutting face functioning as a gap limitation member to ensure a predetermined gap dimension when the cover is fixedly tightened to the base.

16. The waterproof control unit according to claim 3, wherein the cover and the base are made by pressing a sheet metal, wherein the seal gap of both the first seal gap and the second seal gap is a slit-like space formed of the outer step flat portion gap, the terrace slope portion gap and the inner step flat portion gap, respectively, wherein, between the connector housing and the cover forming the first seal gap, the gap setting protrusions functioning as the gap limitation member and the pair of side face convex threads and the fitting concave threads functioning as the planar movement limitation member are provided, wherein the relative positional relationship between the connector housing and the base forming the second seal gap is determined by the assembling accuracy between the circuit board and the base, and wherein the third seal gap is a slit-like space provided on the three sides of the outer periphery of the cover and the base in which a pair of wavy deformed portions are opposite to each other or a slit-like space formed of a pair of terrace slope portions, a pair of outer step flat portions in communication with the terrace slope portions, and a pair of inner step flat portions, the slit-like space including a gap setting abutting face functioning as a gap limitation member to ensure a predetermined gap dimension when the cover is fixedly tightened to the base.

\* \* \* \* \*